(12) United States Patent
Yokoi et al.

(10) Patent No.: US 7,651,813 B2
(45) Date of Patent: Jan. 26, 2010

(54) CONTAINER, BATTERY AND ELECTRIC DOUBLE LAYER CAPACITOR

(75) Inventors: Kiyotaka Yokoi, Shiga (JP); Yoshihiro Ushio, Shiga (JP); Manabu Miyaishi, Shiga (JP); Masakazu Yasui, Ayabe (JP)

(73) Assignee: Kyocera Corporation, Kyoto (JP)

( * ) Notice: Subject to any disclaimer, the term of this patent is extended or adjusted under 35 U.S.C. 154(b) by 910 days.

(21) Appl. No.: 11/286,712

(22) Filed: Nov. 25, 2005

(65) Prior Publication Data

US 2006/0110538 A1     May 25, 2006

(30) Foreign Application Priority Data

Nov. 25, 2004   (JP)  ............................ P2004-340349
Nov. 29, 2004   (JP)  ............................ P2004-344832

(51) Int. Cl.
    *H01M 2/02*      (2006.01)
    *H01M 2/08*      (2006.01)
    *H02B 1/00*      (2006.01)
    *B05D 3/00*      (2006.01)

(52) U.S. Cl. ........................ 429/163; 429/176; 427/299; 427/306; 361/600; 361/679.01

(58) Field of Classification Search ................. 427/306; 429/7
See application file for complete search history.

(56) References Cited

U.S. PATENT DOCUMENTS

| | | | |
|---|---|---|---|
| 6,376,109 | B1 | 4/2002 | Sano et al. |
| 2001/0012193 | A1 | 8/2001 | Watanabe et al. |
| 2002/0086191 | A1 | 7/2002 | Sano et al. |
| 2002/0090537 | A1 | 7/2002 | Sano et al. |
| 2004/0157121 | A1 | 8/2004 | Watanabe et al. |

FOREIGN PATENT DOCUMENTS

| | | |
|---|---|---|
| JP | 2000-106195 | 4/2000 |
| JP | 2001-216952 | 8/2001 |
| JP | 2002-050551 | 2/2002 |
| JP | 2002-198019 | 7/2002 |
| JP | 2003-100569 | 4/2003 |
| JP | 2004-227959 | 8/2004 |

*Primary Examiner*—Jerry Lorengo
*Assistant Examiner*—Joseph V Micali
(74) *Attorney, Agent, or Firm*—Hogan & Hartson LLP

(57) ABSTRACT

A capacitor includes a base having a hollow or open portion in an upper surface for containing a battery element or an electric double layer capacitor element and an electrolytic solution in an inside thereof, a metallized layer formed to a periphery of the base defining the hollow or open portion in the upper surface and a frame member made of metal brazed to the metallized layer so as to surround the hollow or open portion. An inner lateral surface of the frame member is inclined outward, and a corrosion resistant layer is deposited so as to continuously cover the inclined surface and a portion of the surface of the metallized layer situated inward thereof.

7 Claims, 12 Drawing Sheets

CONTAINER, BATTERY AND ELECTRIC DOUBLE LAYER CAPACITOR

BACKGROUND OF THE INVENTION

1. Field of the Invention

The present invention relates to a container for use in a rechargeable battery and an electric double layer capacitor, as well as a battery and an electric double layer capacitor using the container and, more specifically, the present invention relates to a thin battery used for small-sized electronic equipments such as mobile phones and an electric double layer capacitor used for back-up power sources for semiconductor memories and secondary power supply systems for small-sized electronic equipments, as well as a container used for them.

2. Description of the Related Art

In recent years, along with remarkable development of portable equipments typically represented by mobile phones, portable computers, compact video cameras, etc., reduction in the size and the weight has been demanded further. Then, along with increasing demand for batteries as the power supply for such portable equipments, studies for reducing the size and the weight have been conducted vigorously by increasing the energy density of the battery. Particularly, since lithium battery uses lithium of small atomic weight and having high ionization energy, the lithium battery can be a battery capable of obtaining high energy density, being reduced in the size and the weight and, further, capable of recharging, and the lithium battery has been studied vigorously and become used at present for extensive application use including power supplies for portable equipments.

The battery is generally classified into a cylindrical type and a square type and has a structure in which a positive electrode material and a negative electrode material are contained via a separator in a container such as a cell casing made of metal and an electrolytic solution is injected and sealed therein.

Further, in the electric double layer capacitor, positive and negative charges are opposed at an extremely short distance along an interface where two different phases (for example, a solid electrode and an electrolytic solution) are in contact with each other. The electric double layer capacitor is an electric element capable of charging or discharging electric energy by utilizing electrostatic adsorption/desorption of ions at the ion adsorption layer in the electrolytic solution formed on the surface of a carbon material such as graphite, boronated graphite, activated carbon or coke used for positive electrode and negative electrode materials, that is, the electric double layer formed at the surface of the carbon material such as graphite used for the positive and negative electrode materials.

Then, thin rechargeable battery or electric double layer capacitor in which a battery element or an electric double layer capacitor element comprising the positive electrode, the negative electrode and the separator, and an electrolytic solution are contained in a ceramic base as shown in FIG. 10 has been proposed (refer, for example, to Japanese Unexamined Patent Publication JP-A 2001-216952).

A rechargeable battery or electric double layer capacitor according to the related art comprises a container, a positive electrode material A-1, a negative electrode material A-2, a separator A-3 and an electrolytic solution A-4. The container basically includes a ceramic base 11 such as formed of sintered alumina having a metallized layer 11$d$ also serving as a positive electrode plate at a bottom and a lid body 14 made or metal such as an iron(Fe)-nickel(Ni)-cobalt(Co) alloy also serving as a negative electrode plate. The rechargeable battery or the electric double layer capacitor according to the related art is of a hermetically sealed structure having the container in which the separator A-3 containing the electrolytic solution A-4 sandwiched between the positive electrode material A-1 and the negative electrode material A-2 is disposed between the metallized layer 11$d$ and the lid body 14. Charge and discharge at the metallized layer 11$d$ and the lid body 14 is conducted by way of a first conductive layer C electrically connected with the lid body 14 and a second conductive layers D electrically connected with the metallized layer 11$d$ formed at the lower surface of the substrate 11. Further, a frame member 13 can be provided between the ceramic base 11 and the lid body 14 (refer, for example, to Japanese Unexamined Patent Publication JP-A 2004-227959 (pages 4 to 6, FIG. 1)).

In the rechargeable battery or electric double layer capacitor E using the ceramic base 11 shown in FIG. 10, since the ceramic is excellent in the chemical resistance, the ceramic base 11 is less corroded by the electrolytic solution A-4 containing an organic solvent, acid, etc. and the electrolytic solution A-4 is not degraded by the intrusion of an impurity dissolved from the ceramic base 11 into the electrolytic solution A-4, and the performance of the rechargeable battery or electric double layer capacitor E can be maintained favorably.

However, since a metal layer 11$c$ or the frame member 13 for bonding the lid body 14 to the ceramic base 11 is made of the metal, use of the high performance electrolytic solution A-4 cause a problem that these metal is dissolved into the electrolytic solution A-4 to degrade the electrolytic solution A-4.

SUMMARY OF THE INVENTION

The invention has been accomplished in view of the foregoing problems and an object thereof is to provide a container not deteriorating the performance of a battery or an electric double layer capacitor caused by degradation of an electrolytic solution due to the dissolution of ingredients of metal into an electrolytic solution or the leakage of the electrolytic solution outside, as well as a battery and an electric double layer capacitor of high performance using such a container.

The invention provides a container comprising:

a base having a hollow or open portion in one surface, for containing a battery element or an electric double layer capacitor element and an electrolytic solution in an inside thereof;

a metallized layer formed at a periphery of the base defining the hollow or open portion in one surface;

a frame member made of metal having a rectangular cross sectional shape and brazed to the metallized layer so as to surround the hollow or open portion; and a fillet of a brazing material formed from one surface of the frame member to one surface of the metallized layer situated inward thereof.

According to the invention, the container includes the base having the hollow or open portion in one surface, for containing the battery element or the electric double layer capacitor element and the electrolytic solution in the inside thereof, the metallized layer formed at the periphery of the base defining the hollow or open portion in one surface and the frame member made of metal having a rectangular cross sectional shape and brazed to the metallized layer so as to surround the hollow or open portion. The fillet of the brazing material is formed from one surface of the frame member to one surface of the metallized layer situated inward thereof. Accordingly, in a case of forming a corrosion resistant layer for protecting the brazing material and the metallized layer against the electrolytic solution, from the surface of the brazing material to the surface of the metallized layer inward of the brazing material, a corrosion resistant substance can be easily formed by vapor deposition from above the hollow or open portion at an uniform film thickness to the inclined surface of the fillet of the brazing member and the surface of the metallized layer, without forming a portion not vapor-deposited with the corrosion resistant layer to the brazing material and the metallized layer inward thereof.

The invention provides a container comprising:

a base having a hollow or open portion in one surface for containing a battery element or an electric double layer capacitor element and an electrolytic solution in an inside thereof;

a metallized layer formed to a periphery of the base defining the hollow or open portion in one surface;

a frame member made of metal brazed to the metallized layer so as to surround the hollow or open portion, an inner lateral surface thereof being inclined outward; and a corrosion resistant layer deposited so as to continuously cover the inclined surface of the frame member and a portion of the surface of the metallized layer situated inward thereof.

According to the invention, the container includes the base having the hollow or open portion in one surface for containing the battery element, the electric double layer capacitor element and the electrolytic solution in the inside thereof, the metallized layer formed to the periphery of the base defining the hollow or open portion in one surface, and the frame member made of metal brazed to the metallized layer so as to surround the hollow or open portion. The inner lateral surface of the frame member is inclined outward, and the corrosion resistant layer is deposited so as to continuously cover the inclined surface of the frame member and a portion of a surface of the metallized layer situated inward thereof. Accordingly, since the inner lateral surface of the frame member is formed as the inclined surface inclined outward, in a case of applying a corrosion resistant layer for protecting the frame member against the electrolytic solution so as to continuously cover the inclined surface of the frame member and the surface of the metallized layer situated inward thereof, the corrosion resistant layer can be formed easily at an uniform film thickness by vapor depositing the corrosion resistant substance from above the hollow or open portion, without forming a portion not vapor-deposited with the corrosion resistant layer to the inner lateral surface of the frame member.

In the invention, it is preferable that the frame member has a vertical surface perpendicular to the metallized layer between the inclined surface and another surface of the frame member, and the fillet of the brazing material is formed from the inclined surface to one surface of the metallized layer situated inward thereof.

According to the invention, the frame member has the vertical surface perpendicular to the metallized layer between the inclined surface and the other surface of the frame member, and the fillet of the brazing material is formed from the inclined surface to one surface of the metallized layer situated inward thereof. Accordingly, in a case of applying a corrosion resistant layer for protecting the frame member and the brazing material against the electrolytic solution so as to continuously cover the inclined surface of the frame member and the surface of the metallized layer situated inward thereof, the corrosion resistant layer can be formed easily at a uniform film thickness by vapor depositing the corrosion resistant substance from one surface of the hollow or open portion, without forming a portion not vapor-deposited with the corrosion resistant layer to the inner lateral surface of the frame member.

Further, since the fillet of the brazing material in which the brazing material for bonding the frame member to the metallized layer creeps upward in an appropriate amount is formed along the vertical surface of the frame member, the frame member can be bonded firmly to the metallized layer and, since the brazing material does not stagnate excessively inward the frame member, this can prevent exertion of a large stress on the base due to the relatively large difference of the heat expansion of the brazing material from that of the base.

Further, since the length for the inclined surface of the frame member can be shortened to narrow the width of the frame member, this can decrease the stress exerting on the base due to the difference of the thermal expansion between the frame member and the base.

In the invention, it is preferable that the base is made of ceramics.

In the invention, it is preferable that an insulation coating layer is formed from a vicinity of an end of the brazing material inward of the frame member to one surface of the base, and an inner end of the corrosion resistant layer is extended as far as on the insulation coating layer.

According to the invention, the insulation coating layer is formed from the vicinity of the end of the brazing material inward of the frame member to one surface of the base, and the inner end of the corrosion resistant layer is extended as far as on the insulation coating layer. Thus, the step between one surface of the brazing material and one surface of the metallized layer formed at the end of the brazing material is buried with the insulation coating layer, and one surface of the brazing member and one surface of the insulation coating layer are in continuous with no interruption at the midway by the vertical meniscus portion at the end of the brazing material. As a result, since the corrosion resistant layer can be deposited with no interruption from one surface of the brazing material to one surface of the insulation coating layer and the end of the brazing material is no more exposed to the electrolytic solution, the electrolytic solution is not degraded by the dissolution of the ingredients of the brazing material into the electrolytic solution.

In the invention, it is preferable that an insulation coating layer made of sintered alumina is formed from the vicinity of the end of the brazing material inward of the frame member to one surface of the base, and an inner end of the corrosion resistant layer is extended as far as on the insulation coating layer.

According to the invention, the insulation coating layer made of sintered alumina is formed from the vicinity of the end of the brazing material inward of the frame member to one surface of the base, and the inner end of the corrosion resistant layer is extended as far as on the insulation coating layer. With the constitution described above, the insulation coating layer less corroded by the electrolytic solution can be formed to prevent corrosion and dissolution of the metallized layer.

The invention provides a battery comprising:

the container mentioned above;

an electrolytic solution;

a battery element, the electrolytic solution and the battery element being contained in the hollow or open portion of the container; and a lid body bonded to one surface of the frame member so as to close an opening of the hollow or open portion.

According to the invention, the battery contains the electrolytic solution and the battery element in the hollow or open portion of the container according to the invention, and the lid body is bonded to one surface of the frame member so as to close the opening of the hollow or open portion. This can improve the airtight reliability using the container of the invention and render the container less degrading.

The invention provides an electric double layer capacitor comprising:

the container mentioned above;

an electrolytic solution;

an electric double layer capacitor element, the electrolytic solution and the electric double layer capacitor element being contained in the hollow or open portion of the container; and a lid body bonded to one surface of the frame member so as to close an opening of the hollow or open portion.

According to the invention, the electric double layer capacitor contains the electrolytic solution and the electric double layer capacitor element in the hollow or open portion of the container according to the invention, and the lid body is bonded to one surface of the frame member so as to close the opening of the hollow or open portion. This can improve the airtight reliability using the container of the invention and render the container less degrading.

The invention provides a battery comprising:

the container mentioned above;

an electrolytic solution;

a battery element, the electrolytic solution and the battery element being contained in the hollow or open portion of the container; and a lid body made of an iron alloy, bonded to one surface of the frame member so as to close an opening of the hollow or open portion, the lid body and the frame member being bonded via an aluminum-gold-nickel alloy at an outer circumference of the battery and bonded via an aluminum alloy containing aluminum as a main ingredient at an inner circumference of the battery.

According to the invention, the electrolytic solution and the battery element are contained in the hollow or open portion of the container of the invention and the lid body made of the iron alloy is bonded to one surface of the frame member so as to close the opening of the hollow or open portion, the lid body and the frame member are bonded via the aluminum-gold-nickel alloy at the outer circumference and bonded via the aluminum alloy containing aluminum as the main ingredient at the inner circumference. Since the base made of the ceramics excellent in the chemical resistant is used, it is less corroded by the electrolytic solution containing an organic solvent, an acid and the like and, accordingly, this can prevent that the container for battery is corroded to leak the electrolytic solution thereby damaging the external electric circuit substrate. Further, since the ingredients of the container for battery are scarcely dissolved into the electrolytic solution and the airtight reliability is high, this can prevent intrusion of moisture from the outside and can maintain the characteristic of the electrolytic solution favorably for a long time. As a result, the battery performance can be maintained favorably for a long time.

Further, the lid body and the frame member are bonded via the aluminum-gold-nickel alloy at the outer circumference of the battery and bonded via the aluminum alloy containing aluminum as the main ingredient at the inner circumference of the battery. This can bond the lid body and the frame member firmly at the outer circumference to keep favorable airtightness and bond them by the aluminum alloy containing aluminum as the main ingredient at the inner circumference in contact with the electrolytic solution. Therefore, the lid body and the frame member are less corroded by the electrolytic solution and, accordingly, impurity is not dissolved into the electrolytic solution and the electrolytic solution does not leak to the outside since the corrosion at the bonded portion is prevented. Therefore, it is possible to provide a battery using the container for battery in which the lid body is bonded onto the base at a sufficient strength and the airtight reliability is excellent.

The invention provides an electric double layer capacitor comprising:

the container mentioned above;

an electrolytic solution;

an electric double layer capacitor element, the electrolytic solution and the electric double layer capacitor element being contained in the hollow or open portion of the container; and a lid body made of an iron alloy, bonded to one surface of the frame member so as to close the opening of the hollow or open portion, the lid body and the frame member being bonded via an aluminum-gold-nickel alloy at the outer circumference of the electric double layer capacitor and bonded via an aluminum alloy containing aluminum as a main ingredient at the inner circumference of the electric double layer capacitor.

According to the invention, the electrolytic solution and the electric double layer capacitor element are contained in the hollow or open portion of the container of the invention and the lid body made or the iron alloy is bonded to one surface of the frame member so as to close the opening of the hollow or open portion, the lid body and the frame member are bonded via the aluminum-gold-nickel alloy at the outer circumference of the electric double layer capacitor and bonded via the aluminum alloy containing aluminum as the main ingredient at the inner circumference of the electric double layer capacitor. Since the base made of the ceramics excellent in the chemical resistant is used, it is less corroded by the electrolytic solution containing an organic solvent, an acid and the like and, accordingly, this can prevent that the container for electric double layer capacitor is corroded to leak the electrolytic solution thereby damaging the external electric circuit substrate. Further, since the ingredients of the container for electric double layer capacitor are scarcely dissolved into the electrolytic solution and the airtight reliability is high, this can prevent intrusion of moisture from the outside and can maintain the characteristic of the electrolytic solution favorably for a long time. As a result, performance of the electric double layer capacitor can be maintained favorably for a long time.

Further, the lid body and the frame member are bonded via the aluminum-gold-nickel alloy at the outer circumference of the electric double layer capacitor and bonded via the aluminum alloy containing aluminum as the main ingredient at the inner circumference of the electric double layer capacitor. This can bond the lid body and the frame member firmly at the outer circumference to keep favorable airtightness and bond them by the aluminum alloy comprising aluminum as the main ingredient the inner circumference in contact with the electrolytic solution. Accordingly, the lid body and the frame member are less corroded by the electrolytic solution and, accordingly, impurity is not dissolved into the electrolytic solution and the electrolytic solution does not leak to the outside since the corrosion at the bonded portion is prevented. Therefore, it is possible to provide an electric double layer capacitor using the container for electric double layer capacitor in which the lid body is bonded onto the base at a sufficient strength and the airtight reliability is excellent.

BRIEF DESCRIPTION OF THE DRAWINGS

Other and further objects, features, and advantages of the invention will be more explicit from the following detailed description taken with reference to the drawings wherein.

DETAILED DESCRIPTION

Figure 1A:
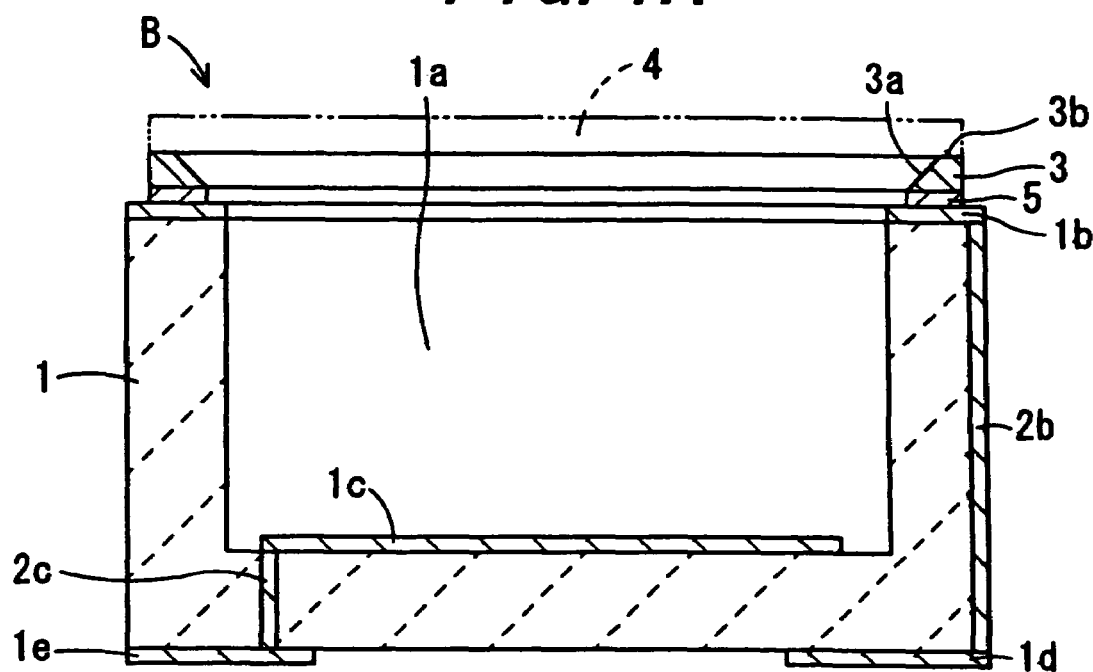
FIG. 1A is a cross sectional view showing a container according to a first embodiment of the invention.

Now referring to the drawings, preferred embodiments of the invention are described below.

A capacitor according to the invention, a battery and an electric double layer capacitor using the container are to be described specifically.

Figure 1B:
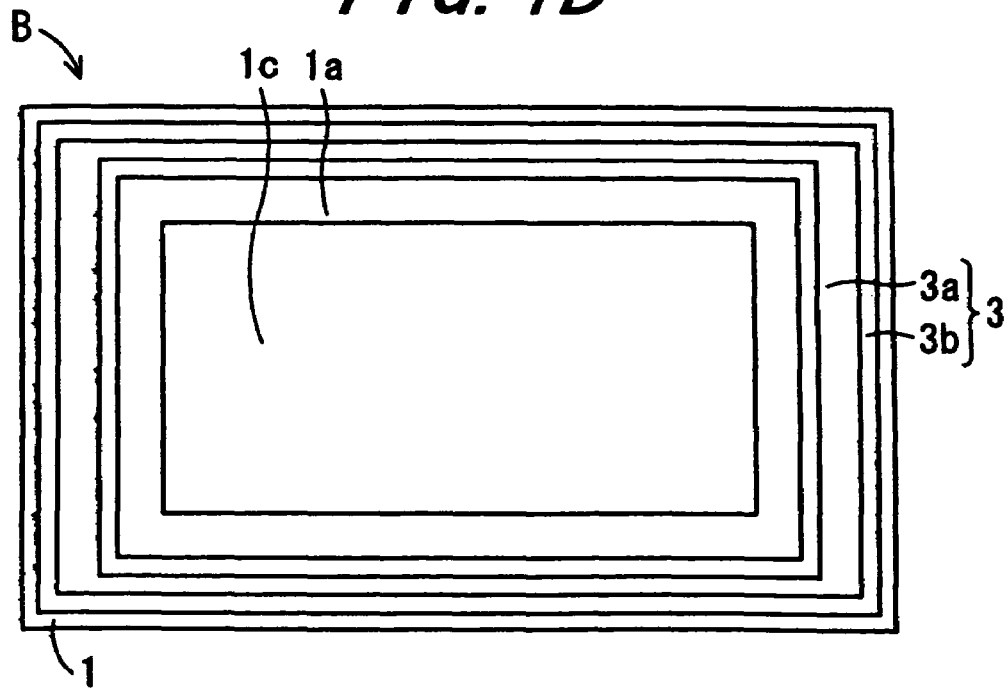
FIG. 1B is a plan view of FIG. 1A.

FIG. 1A is a cross sectional view showing a container according to a first embodiment of the invention, and FIG. 1B is a plan view of FIG. 1A. In the drawings, a container B comprises a base 1 made of ceramic (hereinafter referred to as a base), a frame member 3 and a lid body 4. In FIG. 1A, the lid body 4 is shown by a virtual line.

Figure 2A:
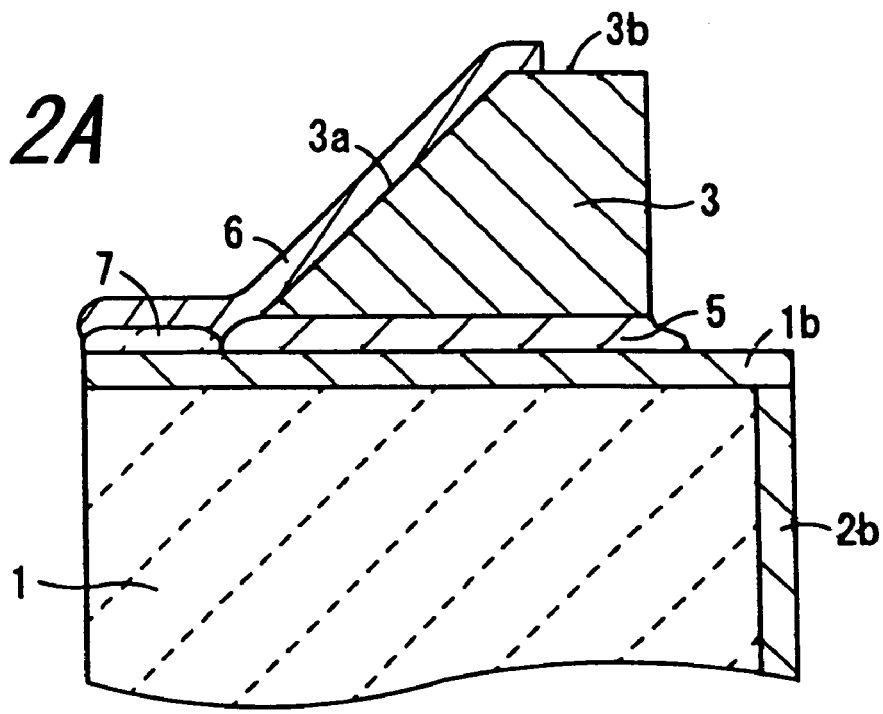
FIG. 2A and FIG. 2B are enlarged cross sectional views for a portion at a periphery or a frame member shown in FIG. 1A.
Figure 2B:
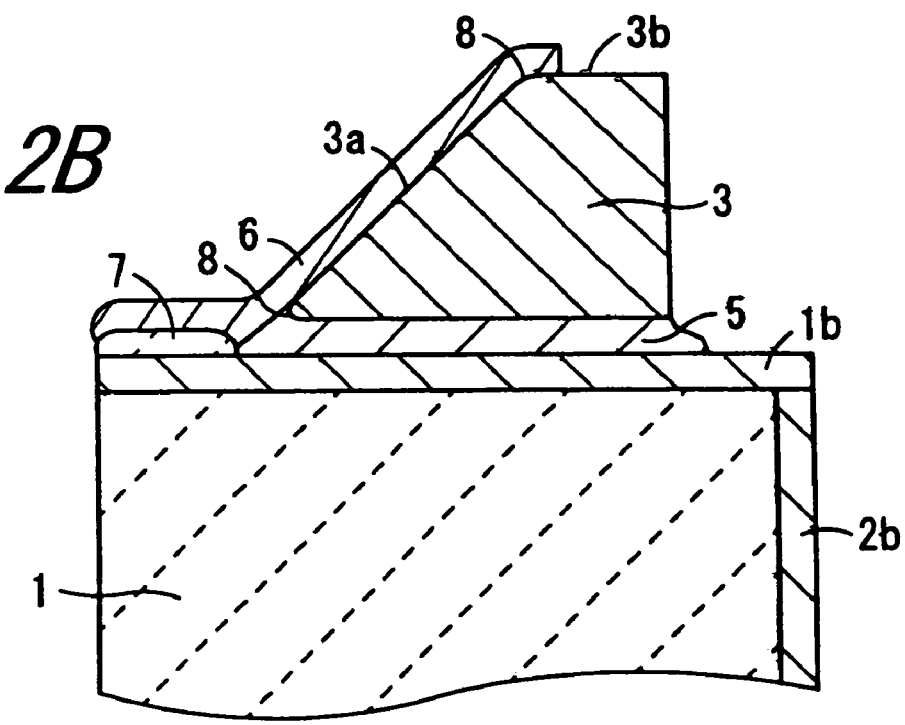
Figure 3A:
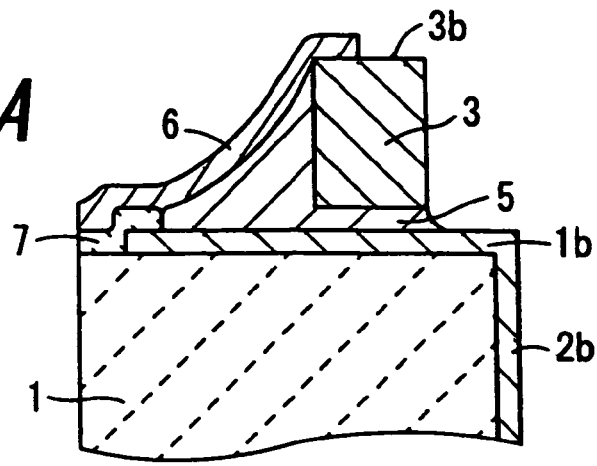
FIGS. 3A to 3C are enlarged cross sectional views for a portion at the periphery of a frame member in a capacitor according to a second embodiment of the invention.
Figure 3B:
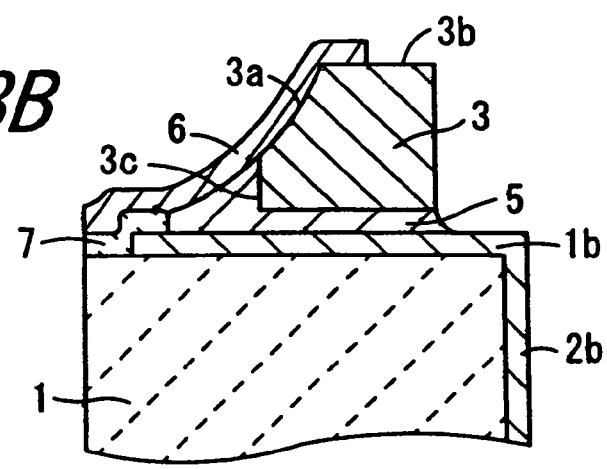
Figure 3C:
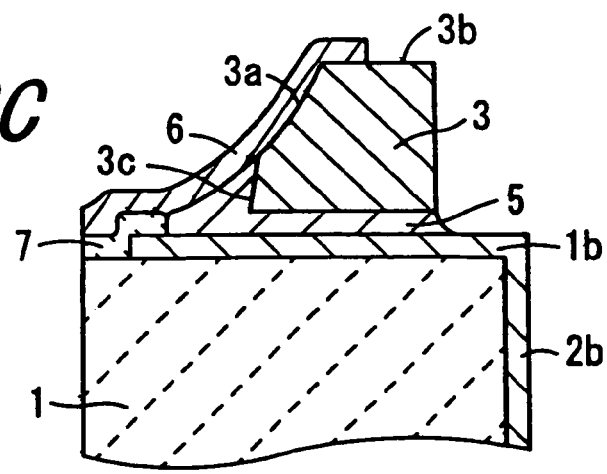

Further, FIGS. 2A and 2B are enlarged cross sectional views near the bonded portion of the frame member 3 and the metallized layer 1b, and FIGS. 3A to 3C are enlarged cross sectional views near the bonded portion of the frame member 3 and the metallized layer 1b of the ceramic container according to a second embodiment of the invention.

In the base 1 of the ceramic container B of the invention, a rectangular or cylindrical hollow or open portion 1a is formed in a central portion at an upper surface serving as one surface. In the base 1, a metallized layer 1b is formed along a periphery at the upper surface of the ceramic base 1 defining the hollow or open portion 1a, and a metal layer 1c is formed on a surface of the ceramic base 1 defining a bottom of the hollow or open portion 1a. Further, a first conductor layer 1d and a second conductor layer 1e are formed to an outer lateral surface or a lower surface serving as another surface of the ceramic base 1, and a first connection conductor 2b is formed from the metallized layer 1b to the first conductor layer 1d, and a second connection conductor 2c is formed from the metal layer 1c to the second conductor layer 1e, respectively.

Further, the metal frame member 3 is brazed to the metallized layer 1b on the upper surface of the ceramic base 1 so as to surround the hollow or open portion 1a. The frame member 3 has an inclined surface 3a formed by inclining the inner lateral surface outward along the entire circumference, and a flat portion 3b having a horizontal flat surface at an upper surface serving as one surface to an outer circumference of the inclined surface 3a.

Alternatively, as shown in FIG. 3A, the frame member 3 may have a rectangular cross sectional shape having a horizontal flat portion 3b at the upper surface and an inner lateral surface perpendicular to the metallized layer 1b. In this case, a fillet of the brazing material 5 for bonding the metallized layer 1b and the frame member 3 is formed along the entire circumference at the inner lateral surface of the frame member 3 formed so as to be a surface inclined outward from the upper surface of the frame member 3 to an upper surface serving as one surface of the metallized layer 1b situated inward thereof.

Alternatively, as shown in FIG. 3B, the frame member 3 may have a vertical surface 3c perpendicular to the metallized layer 1b along the entire circumference between the inclined surface 3a and the lower surface serving as another surface of the inner lateral surface. In this case, the fillet of the brazing material 5 for bonding the frame member 3 from the inclined surface 3a to the upper surface of the metallized layer 1b situating inward thereof is formed along the entire circumference as a surface inclined downward toward the hollow or open portion 1a.

The ceramic base 1 is made of ceramics such as sintered alumina and is prepared as described below. For example, in a case where the ceramic base 1 is formed of sintered alumina, an appropriate organic binder, a solvent, etc. are added and mixed to the starting powder material such as aluminum oxide ($Al_2O_3$), silicon oxide ($SiO_2$), magnesium oxide (MgO), and calcium oxide (CaO) to form a slurry. The slurry is formed into a green sheet by a doctor blade method or a calender roll method and cut into a desired size. Then, a plurality of green sheets selected from them are applied with an appropriate punching fabrication for forming the hollow or open portion 1a, etc.

Then, a metal paste containing a powder of metal such as tungsten (W) as a main ingredient is printed and coated on the green sheet to form a conductor layer as the metallized layer 1b, the metal layer 1c, the first and second connection conductors 2b, 2c, and the first and second conductor layers 1d, 1d, then the green sheets forming the conductor layers are laminated and baked at a temperature of about 1600° C. Thereby, the ceramic base 1 is manufactured.

The metallized layer 1b may be formed, as shown in FIGS. 1A, 1B, 2A and 2B, along the entire upper surface of the ceramic base 1, or may be also formed, as shown in FIGS. 3A, 3B and 3C to the upper surface of the ceramic base 1 partially such that the inner circumferential side, the outer circumferential side or the inner circumferential side and the outer circumferential side of the upper surface of the ceramic base 1 are exposed. That is to say, it may suffice that the metallized layer 1 may be formed at a portion of the upper surface of the base 1 at least to a portion bonded with the frame member 3.

Further, while FIG. 1A shows an example in which the first and the second conductor layers 1d and 1e are formed to the lower surface of the ceramic base 1, the first and the second conductor layers 1d and 1e may be also formed on a lateral surface of the ceramic base 1. In a case of forming the first and second conductor layers 1d and 1e to the lower surface of the ceramic base 1, it provides an advantage that the ceramic base 1 is placed on the upper surface of a flat external electric circuit substrate and can be connected easily to the external electric circuit by a surface mounting method by means of soldering or the like. Further, in a case of forming the first and the second conductor layers 1d and 1e to the lateral surface of the ceramic base 1, it has an advantage capable of connecting them easily and reliably to the external electric circuit substrate by forming protrusions to the wiring conductors of the external electric circuit substrate and connecting them by abutting the first and the second conductor layers 1d, 1e to the protrusions.

Further, while the first connection conductor 2b is formed with a lateral surface conductor of the ceramic base 1 in FIGS. 1A and FIG. 1B, it may be a through connection conductor formed inside the ceramic base 1 vertical to the first conductor layer 1d. Further, while the second connection conductor 2c is forced only of a through connection conductor vertical to the second conductor layer 1e in FIG. 1A to FIG. 1B, it may be formed also in combination with an internal wiring layer in the ceramic base 1 parallel with the first conductor layer 1d, by which an electric circuit can be extended in the ceramic base 1.

Further, metals excellent in corrosion resistance and excellent in wettability with solder, specifically, a nickel (Ni) layer of 1 to 12 μm thickness and a gold (Au) layer of 0.05 to 5 μm thickness are preferably deposited by means of plating, etc. to the exposed surface of the conductors formed to the ceramic base 1 thus manufactured. Particularly, this can effectively suppress easy dissolution of the metallized layer 1b and the metal layer 1c formed inside the ceramic container B by the voltage due to charge and discharge. Further, in the first and the second conductor layers 1b, 1e, wettability with the solder is improved to make the bonding strength with the wiring conductors on the external electric circuit substrate more strong.

In a case where the thickness of the Ni layer is less than 1 μm, it is difficult to effectively prevent oxidative corrosion of each conductor formed of metallized layer or suppress dissolution of metal ingredients from each of the conductors, tending to deteriorate the battery performance. Further, in a case where the thickness of the Ni layer exceeds 12 μm, it takes a much time for plating tending to lower the productivity and tending to increase the electric resistance.

In a case where the thickness of the Au layer is less than 0.05 μm, it is difficult to form an Au layer of uniform thickness tending to cause a portion where the Au layer is extremely thin or a portion where the Au layer is not formed tending to lower the effect of preventing oxidative corrosion or tending to lower the wettability with solder. In a case where the thickness of the Au layer exceeds 5 μm, it takes a much time for plating tending to lower the productivity.

Further, to the upper surface of the ceramic base 1, a frame member 3 made of metal such as an iron (Fe)—Ni-cobalt (Co) alloy or aluminum (Al) is brazed by means of a brazing member 5 such as a silver (Ag) braze or Al braze to the metallized layer 1b. It is preferred that the metallized layer 1b formed of W or the like is formed to the upper surface of the ceramic base 1 at a portion where the frame member 3 is brazed, and plating such as Ni is applied to the surface thereof. This constitution improves the wettability with the brazing material 5 at the upper surface of the ceramic base 1 and makes the bonding strength more strong between the upper surface of the ceramic base 1 and the frame member 3.

As shown in FIGS. 1A, 1B, 2A and 2B, the frame member 3 has an inclined surface 3a formed by inclining the inner lateral surface outward, that is, inclining the inner lateral surface along the entire circumference downward to the hollow or open portion 1a. Further, it has a flat portion 3b at the outer circumference to the inclined surface 3a with the upper surface being formed as a flat surface parallel with the upper surface of the ceramic base 1. The inclined surface 3a of the frame member 3 can be fabricated easily by applying pressing or the like to the frame member 3.

The metallized layer 1b, the frame member 3 and the brazing material 5 for bonding the metallized layer 1b and the frame member 3 may be occasionally corroded by the electrolytic solution depending on the kind of an electrolytic solution encapsulated in the ceramic container B. In such a case, since the impurity is dissolved into the electrolytic solution to deteriorate the performance of the battery A or the electric double layer capacitor A, it is necessary to apply a corrosion resistant layer 6 to the inner lateral surface of the frame member 3 and the metallized layer 1b and the brazing material 5 situated on the side nearer to the hollow or open portion 1a than the inner side (inward) of the frame member 3 for protecting them from the electrolytic solution. A material for the corrosion resistant layer 6 includes a metal film such as aluminum (Al), platinum (Pt) and gold (Au), or a resin film, In a case where the corrosion resistant layer 6 is a metal film, the corrosion resistant layer 6 is deposited and formed by a vapor deposition method.

The frame member 3 has the inclined surface 3a inclined at the inner lateral surface outward along the entire circumference, that is, inclined downward toward the hollow or open portion 1a. Thereby, in a case of applying the corrosion resistant layer 6 for protecting the frame member 3 against the electrolytic solution, to the inner lateral surface of the frame member 3, when a corrosion resistant substance forming the corrosion resistant layer 6 is vapor deposited from above the ceramic base 1 by using a vapor deposition method, the corrosion resistant layer 6 can be easily vapor deposited to the inner lateral surface of the frame member 3 reliably and at a uniform thickness since the inner circumferential surface of the frame member 3 is formed as the inclined surface 3a. Therefore, a portion not vapor deposited with the corrosion resistant layer 6 to the inner lateral surface of the frame member 3 does not occur.

Further, since the frame member 3 has the flat portion 3b, it can be bonded firmly by bonding the frame member 3 at the flat portion 3b with a lower surface of the lid body 4, and the inside of the ceramic container B can be reliably kept airtight.

The corrosion resistant layer 6 formed of an Al layer is vapor deposited and formed preferably to the inclined surface 3a of the frame member 3, the surface of the brazing material 5 situated to the side of the hollow or open portion 1a inward the inner lateral surface of the frame member 3, for bonding the metallized layer 1b and the frame member 3, and the upper surface of the metallized layer 1b situated to the side of the hollow or open portion 1a inward the inner lateral surface of the frame member 3. With the constitution described above, a passive film excellent in the corrosion resistance can be formed to the surface of the frame member 3, the brazing material 5 situated to the side of the hollow or open portion 1a inward the inner lateral surface of the frame member 3, and the corrosion resistant layer 6 of the metallized layer 1b, to prevent the frame member 3, the brazing material 5 and the metallized layer 1b from corroding by the electrolytic solution or external atmosphere. As a result, it is possible to prevent corrosive degradation by the electrolytic solution inside the battery or electric double layer capacitor, thereby making the reliability of the airtightness excellent.

More preferably, as shown in FIG. 2B, the upper and lower corners at the inner lateral surface of the frame member 3 are formed each as a curved surface 8. With the constitution described above a smooth meniscus of the brazing material 5 can be formed between the inclined surface 3a of the frame member 3 and the metallized layer 1b, and a corner between the inclined surface 3a and the flat portion 3b at the upper surface of the frame member 3 can be eliminated, and the corrosion resistant layer 6 can be deposited and formed from the flat portion 3b to the inclined surface 3a of the frame member 3 to the upper surface of the metallized layer 1b continuously with no interruption. Accordingly, this can effectively prevent that the corrosion resistant layer 6 is disconnected and the frame member 3, the brazing member 5 or the metallized layer 1b is corroded by the electrolytic solution.

Further, the brazing material 5 such as Al brazing material is preferably welded previously to the upper surface of the frame member 3 or a plating layer such as Ni plating layer or the like formed on the frame member 3. With the constitution described above upon bonding the lid body 4 by welding, since the welded brazing material 5 is melted to braze the frame member 3 and the lid body 4, the brazing material prevails under wetting along the lid body 4, and fills the gap between the lid body 4 and the upper surface of the metal frame member 3, the electrolytic solution less intrudes into the gap to make the bonding more strong between the lid body 4 and the frame member 3. This can also improve the reliability of the bonding between the lid body 4 and the ceramic base 1.

More preferably, the brazing material is Al brazing material and this provides an effect that the brazing material is less corroded against the electrolytic solution encapsulated inside the hollow or open portion 1a. As a result, a ceramic container B excellent in the reliability of the airtightness can be obtained.

Further, for the frame member 3, it may be structured as shown in FIG. 3A, that the member has a rectangular cross sectional shape with the upper surface being a flat portion 3b and the inner lateral surface being a surface vertical to the metallized layer 1b, and the fillet of the brazing material 5 for bonding the metallized layer 1b and the frame member 3 is formed to the inner lateral surface of the frame member 3 such that the surface is inclined downward along the entire circumference toward the hollow or open portion 1a from the upper surface of the frame member 3 to the upper surface of the metallized layer 1b.

With the constitution described above, in a case of applying the corrosion resistant layer 6 for protecting the frame member 3 and the brazing material 5 against the electrolytic solution, the corrosion resistant layer 6 can be vapor deposited to a uniform film thickness on the surface of the fillet of the brazing material 5 stagnated at the inner lateral surface of the frame member 3, without forming a portion not vapor deposited with the corrosion resistant layer 6 to the inner lateral surface of the frame member 3.

Further, the frame member 3 may be also formed in a shape as shown in FIG. 3B that the frame member has an inclined surface 3a inclined downward at the upper portion of the inner lateral surface to the hollow or open portion 1a along the entire circumference, a vertical surface 3c between the inclined surface 3a and the lower surface as a surface vertical to the metallized layer 1b along the entire circumference, and a flat portion 3b in parallel with the upper surface of the ceramic base 1 along the outer circumference to the inclined surface 3a, and the surface of the fillet of the brazing material 5 for bonding the metallized layer 1b and the frame member 3 is inclined downward toward the hollow or open portion 1a so as to form a continuous inclined surface from the inclined surface 3a of the frame member 3 to the upper surface of the metallized layer 1b along the entire circumference to the vertical portion 3c of the frame member 3.

With the constitution described above, in a case of applying the corrosion resistant layer 6 for protecting the frame member 3 and the brazing material 5 against the electrolytic solution to the inner lateral surface of the frame member 3, the corrosion resistant layer 6 can be vapor deposited with a uniform film thickness to the inclined surface 3a of the frame member 3, the surface of the fillet of the brazing material 5, and the surface of the metallized layer 1b, without forming a portion not vapor deposited with the corrosion resistant layer 6 to the inner circumferential surface of the frame member 3.

Further with the constitution described above, since the fillet of the brazing material 5 is formed to the vertical surface 3c of the frame member 3 where the brazing material 5 for bonding the frame member 3 to the metallized layer 1b creeps upward in an appropriate amount, the frame member 3 can be firmly bonded with the metallized layer 1b and, since the brazing material 5 does not stagnate excessively inward the frame member 3, it is possible to prevent that the stress exerts greatly on the ceramic base 1 due to the relatively large difference of the heat expansion of the brazing material from that of the ceramic base 1.

Further, since the length of the inclined surface 3a can be shortened to narrow the width of the frame member 3, it is possible to lower the stress exerting on the ceramic base 1 due to the difference of the heat expansion between the frame member 3 and the ceramic base 1.

Further, in the frame member 3 shown in FIGS. 1A, 1B, 2A and 2B, the vertical surface 3c between the inclined surface 3a and the lower surface is not necessarily vertical but it may be in the form with a more abrupt angle of inclination than that of the inclined surface 3a at the midway as shown in FIG. 3C. With the constitution described above, it is possible to form a vertical surface 3c at an angle of inclination easily forming a preferred fillet of the brazing material 5.

Further, although not illustrated, the inclined surface 3a may be any of various curved surfaces such as an arcuate shape or parabolic shape.

Further, the insulation coating layer 7 is preferably formed from the vicinity of the end of the brazing material 5 and the inner side of the metallized layer 1b inward of the frame member 3 (on a side of hollow or open portion 1a) to the upper surface of the ceramic base 1. This can decrease the difference in view of the height between the upper surface of the brazing material 5 and the upper surface of the insulation coating layer 7. Accordingly, when the inner end of the corrosion resistant layer 6 extends as far as above the insulation coating layer 7, the corrosion resistant layer 6 can be continuously deposited with no interruption from the inclined surface 3a of the frame member 3 to the upper surface of the brazing material 5 and to the upper surface of the insulation coating layer 7 and, since the end of the brazing material 5 is no more exposed to the electrolytic solution, the ingredients of the brazing material 5 is not dissolved into the electrolytic solution and degradation of the electrolytic solution occurs no more.

Further, as shown in FIGS. 3A to 3C, it is preferable that the metallized layer 1b is formed partially such that the metallized layer 1b does not reach the outer circumference of the ceramic base 1 defining the hollow or open portion 1a, that is, the inner circumference at the upper surface of the ceramic base 1 is exposed, and the inner circumferential end of the metallized layer 1b is also coated with the insulation coating layer 7. With the constitution described above, since the upper surface and the end face of the metallized layer 1b are also protected, it is possible to prevent degradation of the electrolytic solution by the corrosion of the metallized layer 1b, degradation of the airtightness due to the corrosion of the metallized layer 1b and corresponding intrusion of a moisture from the outside of the container and, further, leakage of the electrolytic solution along with progress of the corrosion.

Figure 5:
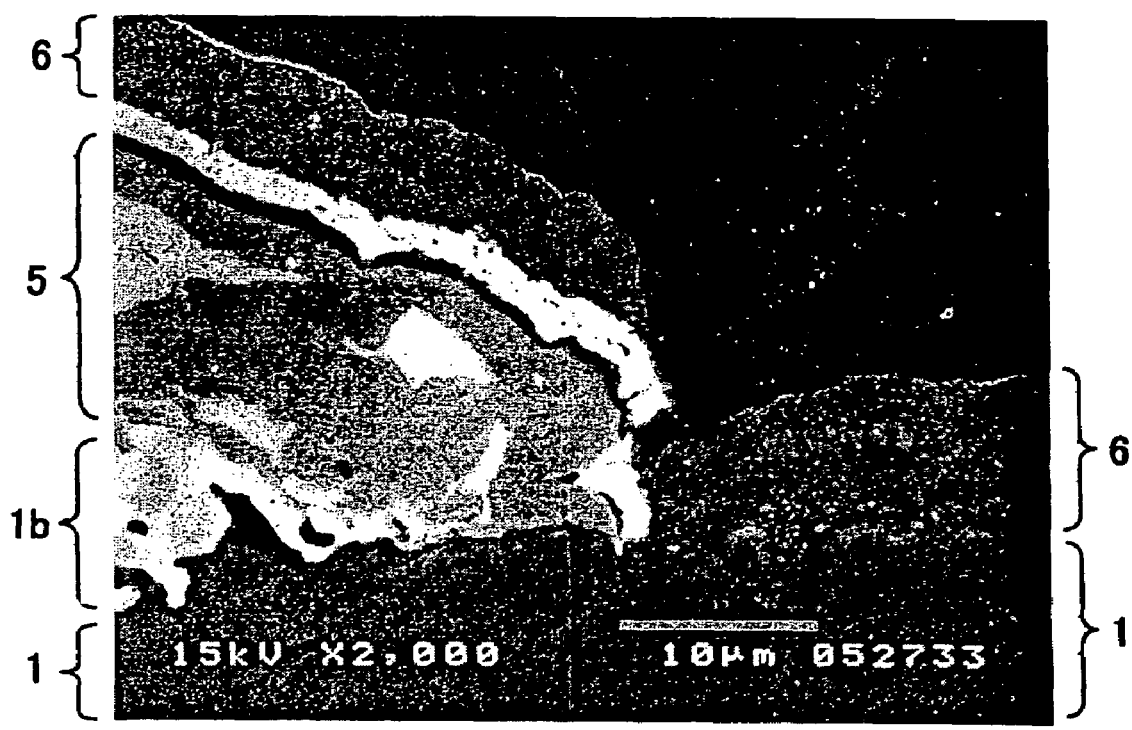
FIG. 5 is an enlarged view for a portion for explaining a vicinity of an end of a brazing material.

In a case of forming the corrosion resistant layer 6 without applying the insulation coating layer 7, while the brazing material 5 flowing on the upper surface of the metallized layer 1b prevails under wetting for the upper surface of the metallized layer 1b as shown in SEM photograph of FIG. 5, a substantially vertical meniscus surface at the end of the brazing material 5 is occasionally formed by the factor such as the wettability and viscosity of the brazing material 5. In a case of forming the corrosion resistant substance to such a surface from above the ceramic base 1 defining the hollow or open portion 1a by a vapor deposition method or a sputtering method from the inclined surface of the frame member 3 to the upper surface of the ceramic base 1, since the flying track of the atoms of the corrosion resistant substance is linear, the corrosion resistant substance is less deposited to the nearly vertical meniscus surface of the brazing material 5 substantially parallel with the flying track, to occasionally result in a state where the corrosion resistant layer 6 is disconnected at the end of the brazing material 5 as shown in FIG. 5. Then, in a case where the electrolytic solution of the battery or the electric double layer capacitor is in contact with the brazing material 5, etc. at the portion where the corrosion resistant layer 6 is disconnected, this may occasionally result in a problem of corroding the brazing material 5 or the like. On the contrary, when the insulation coating layer 7 is formed as far as the vicinity of the end of the brazing material 5, since the upper surface of the brazing material 5 and the upper surface of the insulation coating layer 7 are in a substantially continuous surface not forming the nearly vertical surface, the corrosion resistant layer 6 can be easily deposited continuously with no interruption.

The insulation coating layer 7 is formed by printing a paste obtained by kneading the powder identical with the ceramic powder used for the ceramic base 1 with a binder, an organic solvent, a plasticizer or the like from the upper surface of the ceramic base 1 to the upper surface of the metallized layer 1b by using a screen printing method or the like and sintering the same together with the ceramic base 1.

In this case, the insulation coating layer 7 preferably has a shrinkage ratio substantially equal with the shrinkage ratio of the green sheet of the ceramic base 1. In a case where the respective shrinkage ratios are not equal, warps occur to the upper surface of the ceramic container B and gaps are formed between the lid body 4 and the upper surface of the ceramic base 1 even by the use of the frame member 3, occasionally failing to ensure the airtightness. Accordingly, in a case where the ceramic base 1 is formed of sintered alumina, it is preferred that the insulation coating layer 7 is formed of sintered alumina.

Further, in a case where the insulation coating layer 7 is formed of sintered alumina, since sintered alumina is less corrosive to the electrolytic solution, it also provides a preferred protective layer against the electrolytic solution.

As described above, when the lid body 4 made of a metal such as Fe—Ni—Co alloy or Al alloy is welded to the ceramic container B in which the corrosion resistant layer 6 is formed from the inclined surface 3a on the inner lateral surface of the frame member 3 to the upper surface of the ceramic base 1, to cover the hollow or open portion 1a of the ceramic base 1, the ceramic container B in which the inside of the ceramic base 1 can be sealed reliably in an airtight manner and the surface of the frame member 3, the brazing material 5 and the metallized layer 1b is less corrosive to the electrolytic solution is formed. Then, it is possible to prevent external moisture content or oxygen from intruding into the electrolytic solution inside the ceramic base 1 passing through an interface between the ceramic base 1 and the lid body 4, or through the corroded portion of the frame member 3, etc.

Figure 4:
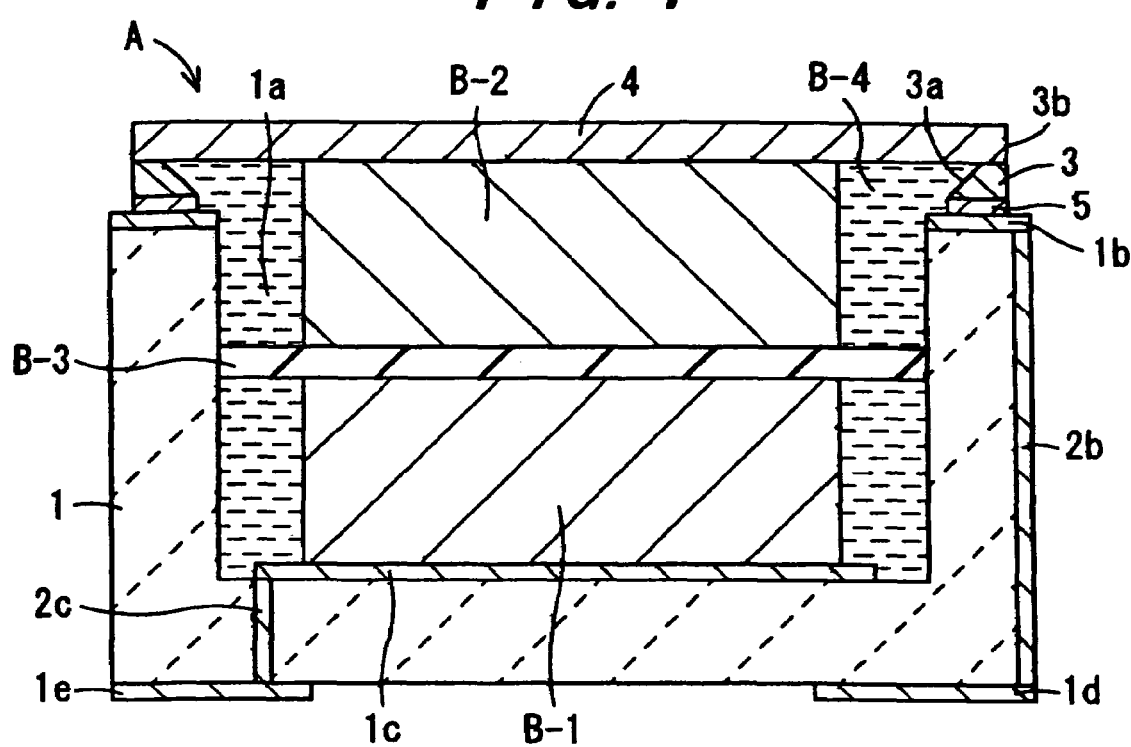
FIG. 4 is a cross sectional view showing a battery or an electric double layer capacitor according to an embodiment of the invention.

Then, the battery or the electric double layer capacitor according to the invention is to be described specifically below. FIG. 4 is a cross sectional view showing a battery or an electric double layer capacitor according to an embodiment of the invention. The battery A comprises the ceramic container B, a positive electrode plate B-1, a negative electrode plate B-2, an insulation sheet B-3 and an electrolytic solution B-4. An electric double layer capacitor A comprises the ceramic container B, a first electrode B-1, a second electrode B-2, a separator B-3 and an electrolytic solution B-4.

In the battery A of the invention, a battery element and an electrolytic solution B-4 are contained in the ceramic container B, and the lid body 4 is welded to the upper surface of the frame member 3 so as to close an opening of the hollow or open portion 1a. The battery element comprises the positive electrode plate B-1, the negative electrode plate B-2 and the insulation sheet B-3. The positive electrode plate B-1 is connected to the metal layer 1c so as to cover the metal layer 1c. The negative electrode plate B-2 is closely in contact with the upper surface of the positive electrode plate B-1 via the insulation sheet B-3 impregnated with the electrolytic solution B-4 and abutted against the lower surface of the lid body 4 rendered conductive at least at the lower surface and electrically connected therewith.

Such an example has been shown that the positive electrode plate B-1 is arranged below the negative electrode plate B-2 and is electrically connected to the metal layer 1c, and the negative electrode plate B-2 is electrically connected to the lid body 4. However, the arrangement of the positive electrode plate B-1 and the negative electrode plate B-2 may be turned upside down. That is, the negative electrode plate B-2 is electrically connected to the metal layer 1c, and the positive electrode plate B-1 is arranged above the negative electrode plate B-2 via the insulation sheet B-3 and is electrically connected to the lower surface of the lid body 4.

In the same manner, in the electric double layer capacitor A of the invention, an electric double layer capacitor element and an electrolytic solution B-4 are contained in the ceramic container B, and the lid body 4 is welded to the upper surface of the frame member 3 so as to close the opening of the hollow or open portion 1a. The electric double layer capacitor element comprises the first electrode B-1, the second electrode B-2 and the separator B-3. The first electrode B-1 is connected to the metal layer 1c so as to cover the metal layer 1c. The second electrode B-2 is closely in contact with the upper surface of the first electrode B-1 via the separator B-3 impregnated with the electrolytic solution B-4 and abutted against the lower surface of the lid body 4 rendered conductive at least at the lower surface and electrically connected therewith.

This provides the battery A or the electric double layer capacitor A having high reliability and excellent in the mass productivity by using the ceramic container B according to the invention. Further, the metal layer 1c can be connected so as to be covered by the positive electrode plate (or first electrode) B-1 and the metal layer 1c is less corroded by the electrolytic solution B-4.

The positive electrode plate B-1 is formed of a plate-like body or sheet-like body containing a conductive material such as a positive electrode active substance, for example, $LiCoO_2$ or $LiMn_2O_4$, and a conductive material such as acetylene black or graphite. The negative electrode plate B-2 is formed of a plate-like body or sheet-like body containing a negative electrode active substance made of a carbon material such as coke or carbon fiber.

The positive electrode plate B-1 is manufactured by adding the conductive material to the positive electrode active substance, adding and mixing a binder such as polytetrafluoroethylene or polyvinylidene fluoride to form a slurry, forming the slurry into a sheet-like shape by using a well-known doctor blade method or the like and then cutting the sheet, for example, into a square shape.

In the same manner, the negative electrode plate B-2 is manufactured by adding the conductive material to the negative electrode active substance, adding and mixing polytetrafluoroethylene or polyvinylidene fluoride to form a slurry, forming the slurry into a sheet-like shape by using a well-known doctor blade method or the like and then cutting the sheet, for example, into a square shape.

Further, the insulation sheet B-3 is formed of, for example, a non-woven fabric made of polyolefin fiber or finely porous membrane made of polyolefin. The electrolytic solution B-4 filled inside the ceramic container B is such an electrolytic solution that a lithium salt such as lithium borate tetrafluoro borate and an acid such as hydrochloric acid, sulfuric acid or nitric acid are dissolved in an organic solvent such as dimethoxyethane or propylene carbonate. The insulation sheet B-3 is impregnated with the electrolytic solution B-4 and placed between the positive electrode plate B-1 and the negative electrode plate B-2, thereby preventing contact between the positive electrode plate B-1 and the negative electrode plate B-2, and enabling movement of ion, for example, lithium ion in the electrolytic solution B-4 between the positive electrode plate B-1 and the negative electrode plate B-2.

Further, in the electric double layer capacitor A of the invention, the first electrode B-1 and the second electrode B-2 is obtained, for example, by carbonating and activating phenol resin fibers (novoloid fibers). The activation is conducted by bringing the fibers into contact with an activating gas such as steams at high temperature in a high temperature atmosphere of from 800 to 1000° C. The first electrode B-1 and the second electrode B-2 are manufactured by a step of gasifying volatile ingredients or a portion of carbon atoms in carbides of the fibers to develop a fine structure mainly of 1 to 10 nm to increase its internal surface area to $1 \times 10^6$ $m^2$/kg or more The electric double layer capacitor A of the invention has no polarity for the first and second conductor layers 1d, 1e, and they can be used with the first conductor layer 1d being as a cathode and the second conductor layer 1e being as an anode, and vice versa.

The electrolytic solution B-4 of the electric double layer capacitor A is such an electrolytic solution that, for example, a lithium salt such as lithium hexafluoro phosphate ($LiPF_6$), or a quaternary ammonium salt such as tetraethyl ammonium tetrafluoro borate (($C_2H_5)_4NBF_4$), is dissolved in a solvent such as propylene carbonate (PC) or sulfolane (SLF).

For the separator B-3, glass fibers or resins having heat resistance such as polyphenylene sulfide, polyethylene terephthalate and polyamide are used.

Then, by injecting the electrolytic solution B-4 using an injection means such as a syringe from the upper side of the hollow or open portion 1a to the inside of the ceramic container B and weld-bonding the lid body 4 in an airtight manner to the upper surface of the frame member 3 after injection, the inside of the ceramic container B can be sealed in an airtight manner.

While the electrolytic solution B-4 described above has high corrosive property and dissolving property, when the ceramic container B of the invention is used, since the ceramic base 1 and the corrosion resistant layer 6 are excellent in the chemical resistance, they are less corroded by the electrolytic solution B-4 containing the organic solvent, the acid, etc., and it is possible to prevent dissolution of the impurity from the ceramic container B into the electrolytic solution B-4 which would intrude to deteriorate the electrolytic solution B-4, and maintain the performance of the battery A or the electrical double layer capacitor A satisfactorily.

The lid body 4 is formed of metal such as an Fe—Ni—Co alloy or Al alloy. The bonding the frame member 3 and the lid body 4 is described below. The lid body 4 is placed to the upper surface of the frame member 3 so as to cover the hollow or open portion 1a of the ceramic base 1. Next, the lower surface of the lid body 4 and the frame member 3 are melted each other by a seam welding method of bonding the lid body 4 with Joule heat generated by rotationally moving a roller under current supply along the edge of the upper surface of the lid body 4 while slightly urging the roller, or by using a supersonic welding method, thereby, the lid body 4 is bonded to the upper surface of the frame member 3. Thus, the battery A or the electric double layer capacitor A is manufactured. Alternatively, the lid body 4 is bonded to the upper surface of the frame member 3 by a brazing method described above.

At least the lower surface of the lid body 4 and the frame member 3 are preferably made of aluminum (Al). With the constitution described above, a passive film of excellent corrosion resistance can be formed on the surface of the frame member 3 and the lid body 4 and it is possible to effectively prevent corrosion by the electrolytic solution B-4 or the external atmosphere to provide excellent reliability of the airtightness in the inside of the battery A.

The lid body 4 may be also a plate material made of Al, a plate material formed with an Al layer at the lower surface of ceramics, or a plate material of, for example, an iron(Fe)-nickel(Ni)-cobalt(Co) alloy or a nickel(Ni)-cobalt(Co) alloy formed with an Al layer at the lower surface thereof. Further, ridges (linearly protruded portion) are preferably formed for the entire outer circumference at the lower surface of the lid body 4. In a case where the lid body 4 is a plate material made of Al, the ridges are formed each in a trigonal cross sectional shape protruded downward at a height of 0.1 mm, by simultaneously forming them upon punching the lid body 4 using a pressing machine, or after punching by a so-called coining method The coining method is a method of stacking a die having an embossing pattern on the die surface and a work, and pressing them vertically while restricting the peripheral extrusion of the work thereby limiting the escape of thickness, and thereby transferring an emboss pattern of a die to the surface of a work.

In a case where the lid body 4 is made of a plate material in which an Al layer is formed to the lower surface of an Fe—Ni—Co alloy, etc., the ridge can be formed by rolling an ingot of such an alloy into a plate, for example, to a thickness of 0.2 to 0.5 mm, and clad-bonding an Al plate, for example, of 0.1 mm thickness to the surface and then forming the ridges by the coining method described above.

Then, the lid body 4 is placed on the upper surface of the frame member 3 at the upper surface of the ceramic base 1 while abutting the ridges formed to the outer circumference of the lid body 4 and irradiating supersonic waves at about several tens KHz, by which the ridges at the lower surface of the lid body 4 are bonded to the Al layer at the surface of the frame member 3 while being crushed along the patterned and indented portion at the flat portion 3b of the frame member 3. In this case, even when the upper surface of the ceramic surface 1 is warped or undulated, bonding is attained because of the difference in the extent of the collapse of the ridges. Then, the supersonic bonding method enables firm bonding of the lid body 4 without deteriorating the airtightness inside the hollow or open portion 1a.

The supersonic bonding method is conducted more specifically for example as described below. That is, it is conducted by setting the ceramic base 1 and the lid body 4 as an object to be bonded between a horn (horned fixture base) having chip as a medium of vibration on the tip, and an anvil, and applying supersonic vibrations at 15 to 30 KHz in the horizontal direction while applying a pressure of about 30 to 50 N via a chip vertically along the outer circumference of the lid body 4 while continuously moving along the outer circumference. Further, the supersonic bonding method may be a method of conducting bonding for a predetermined length in a short time by making the shape of the chip linear and increasing the pressure in the vertical direction.

In the supersonic bonding method, since oxide membranes and contaminants on the surface of the bonded portion are extruded to the outward direction thereof in the initial stage where supersonic vibrations are applied and the Al crystal grains of the lid body 4 and the frame member 3 are brought closer to each other till they reach an inter-atom distance, whereby attraction force exerts between each of the atoms to obtain a strong bond. In this case, while a temperature ⅓ or less of the melting point of the metal in the usual method of melt-bonding the metal is generated locally, the electrolytic solution B-4 is scarcely denatured with the heat at such an extent and, accordingly, the life of the battery A or the electric double layer capacitor A can be extended.

Further, according to the supersonic bonding method, since other metals are scarcely diffused into Al, a bonded portion at higher corrosion resistance to the electrolytic solution B-4 can be formed.

Figure 6A:
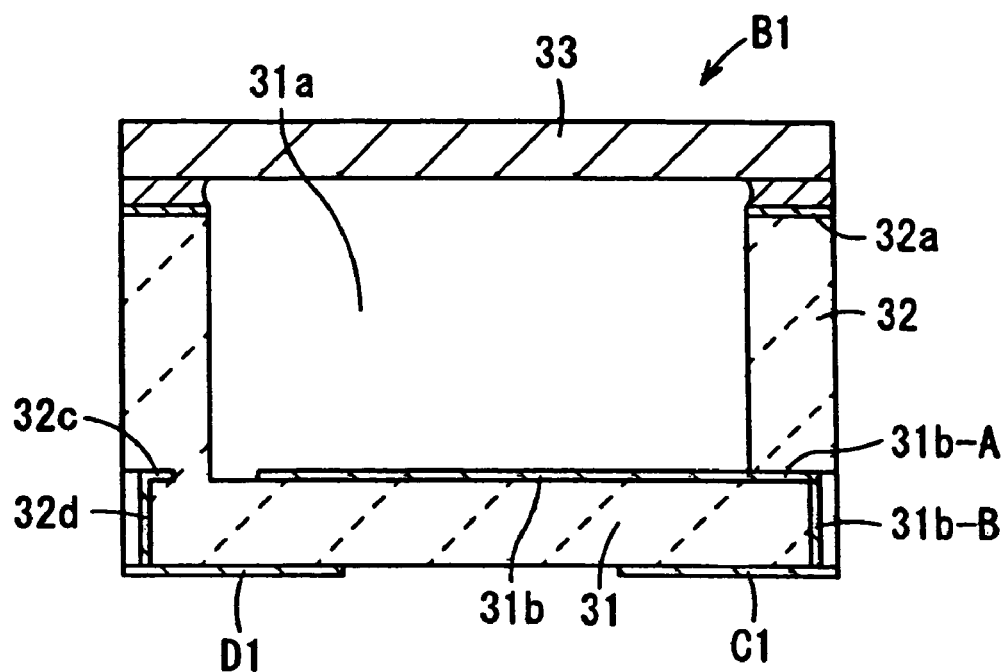
FIG. 6A is a cross sectional view showing a container according to a third embodiment of the invention.
Figure 6B:
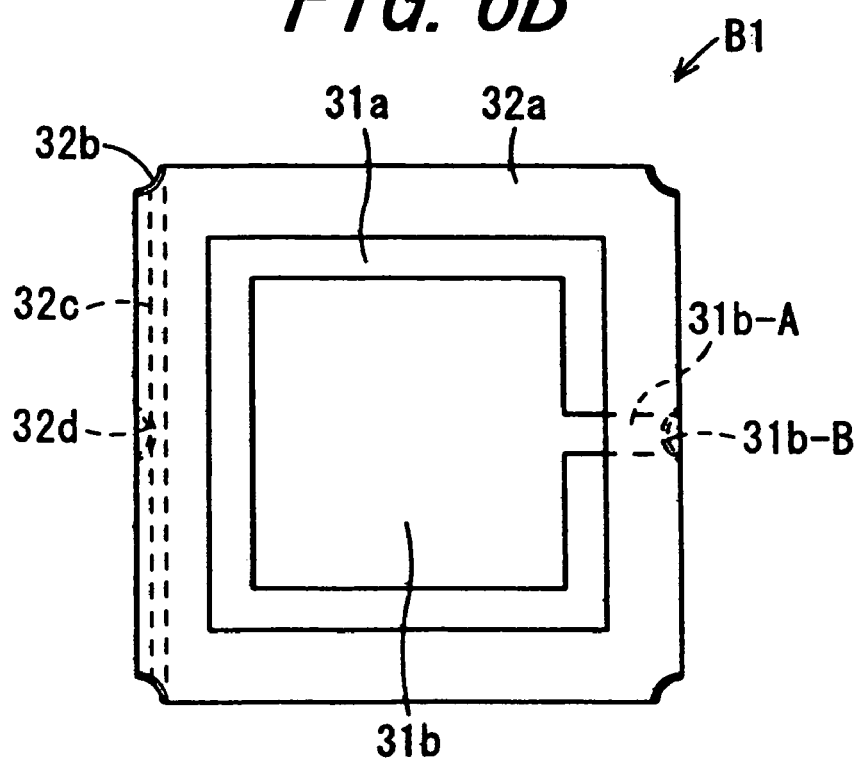
FIG. 6B is a plan view showing in a state where excludes a lid body of the container shown in FIG. 6A.
Figure 7A:
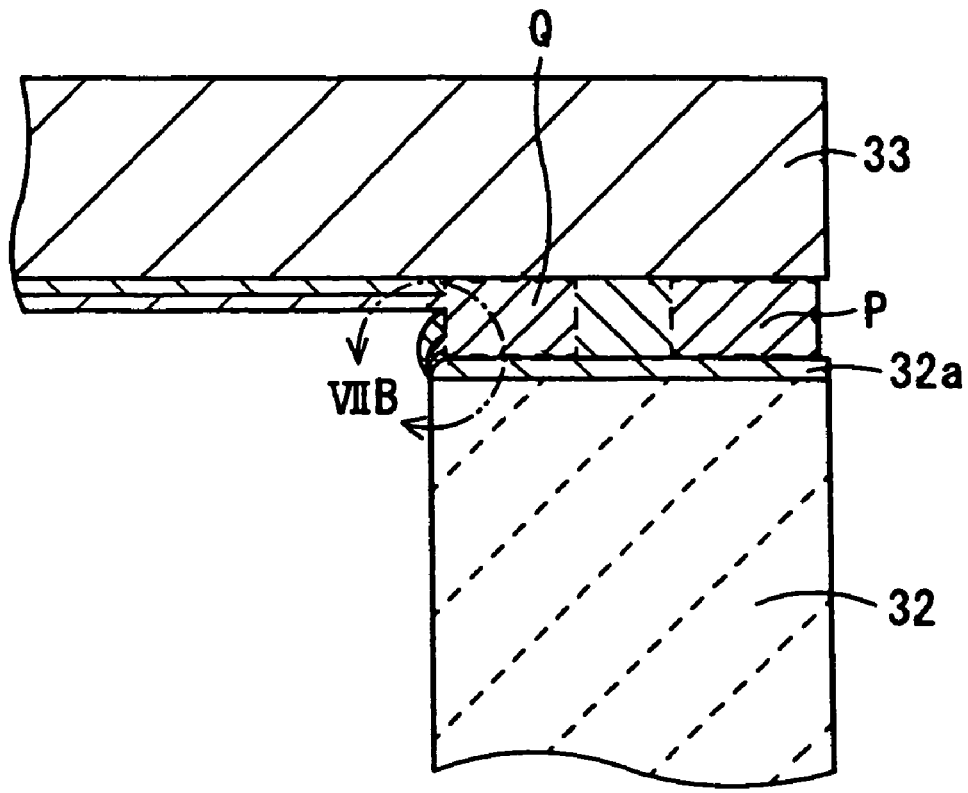
FIG. 7A is an enlarged cross sectional view showing a part of FIG. 6A.
Figure 7B:
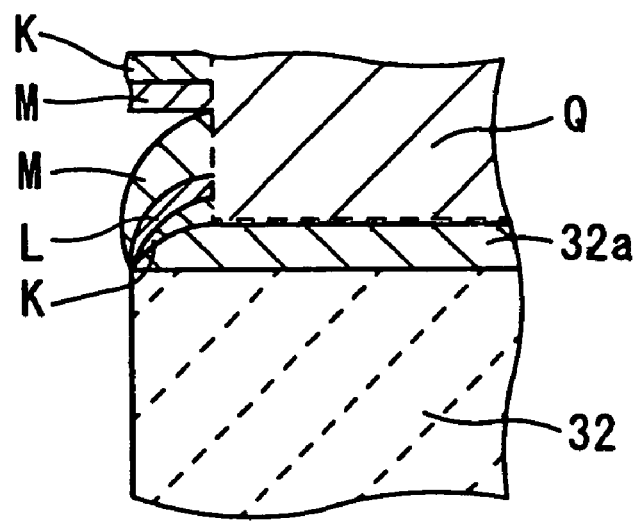
FIG. 7B is an enlarged cross sectional view showing a section VIIB shown in FIG. 7A.
Figure 8:
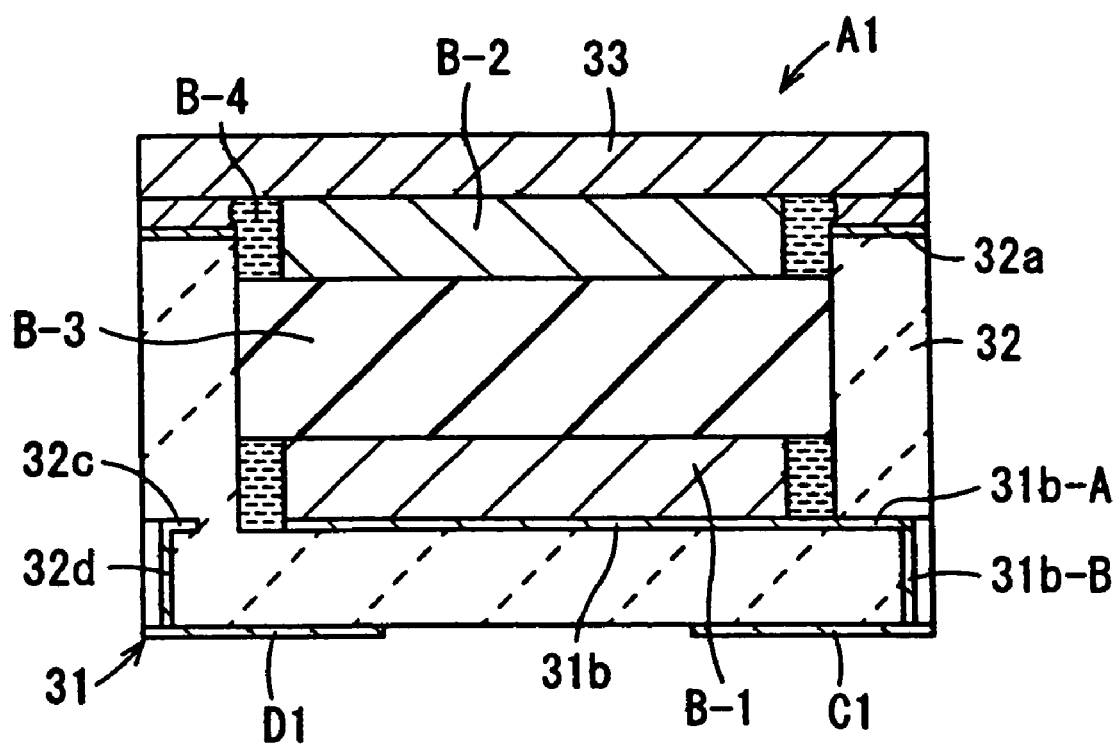
FIG. 8 is a cross sectional view showing a battery or an electric double layer capacitor according to another embodiment of the invention.
Figure 9A:
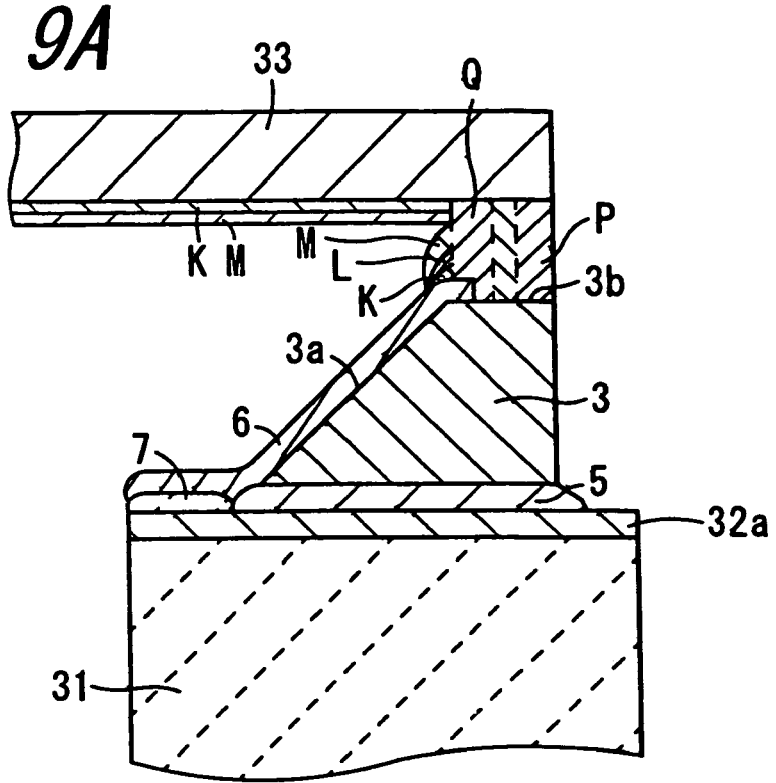
FIGS. 9A to 9E are enlarged cross sectional views showing a part of a container according to a forth embodiment of the invention.
Figure 9B:
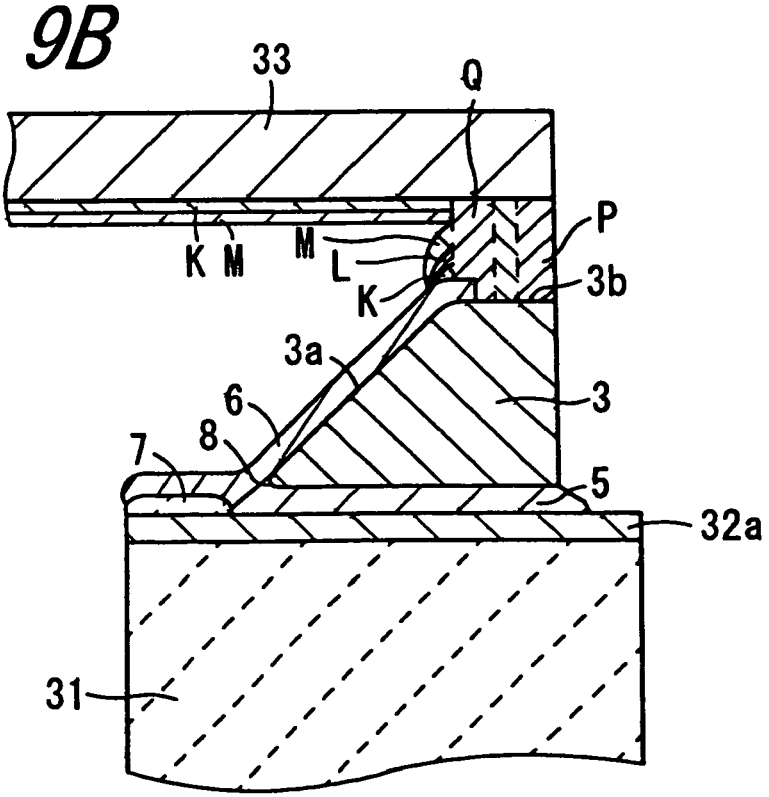
Figure 9C:
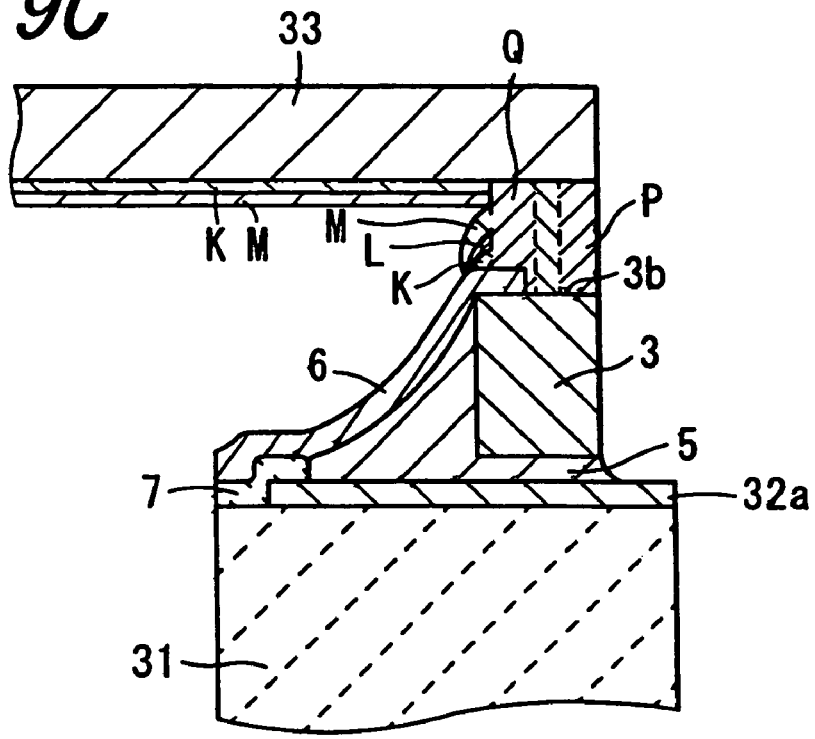
Figure 9D:
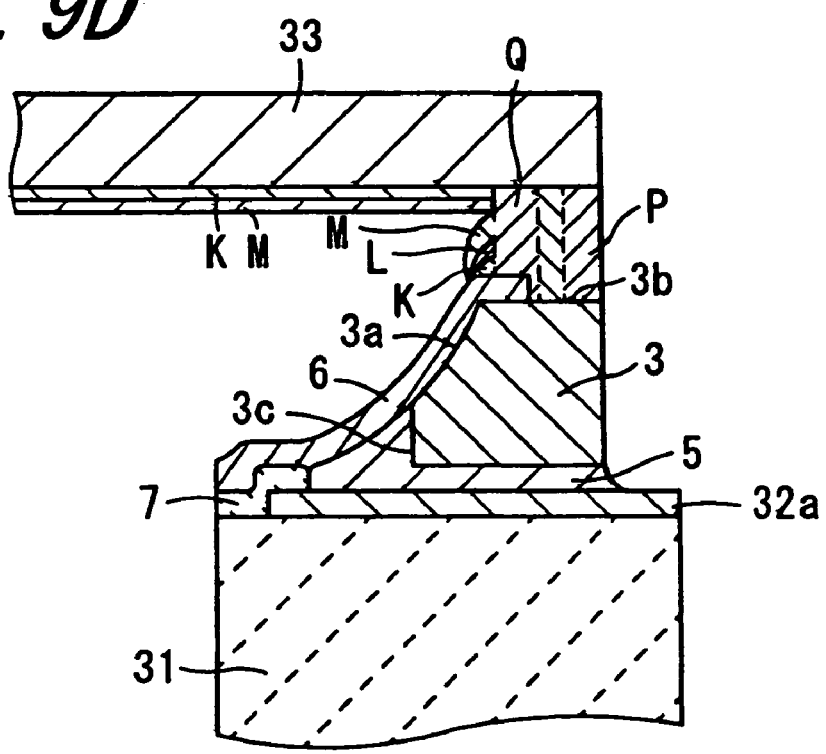
Figure 9E:
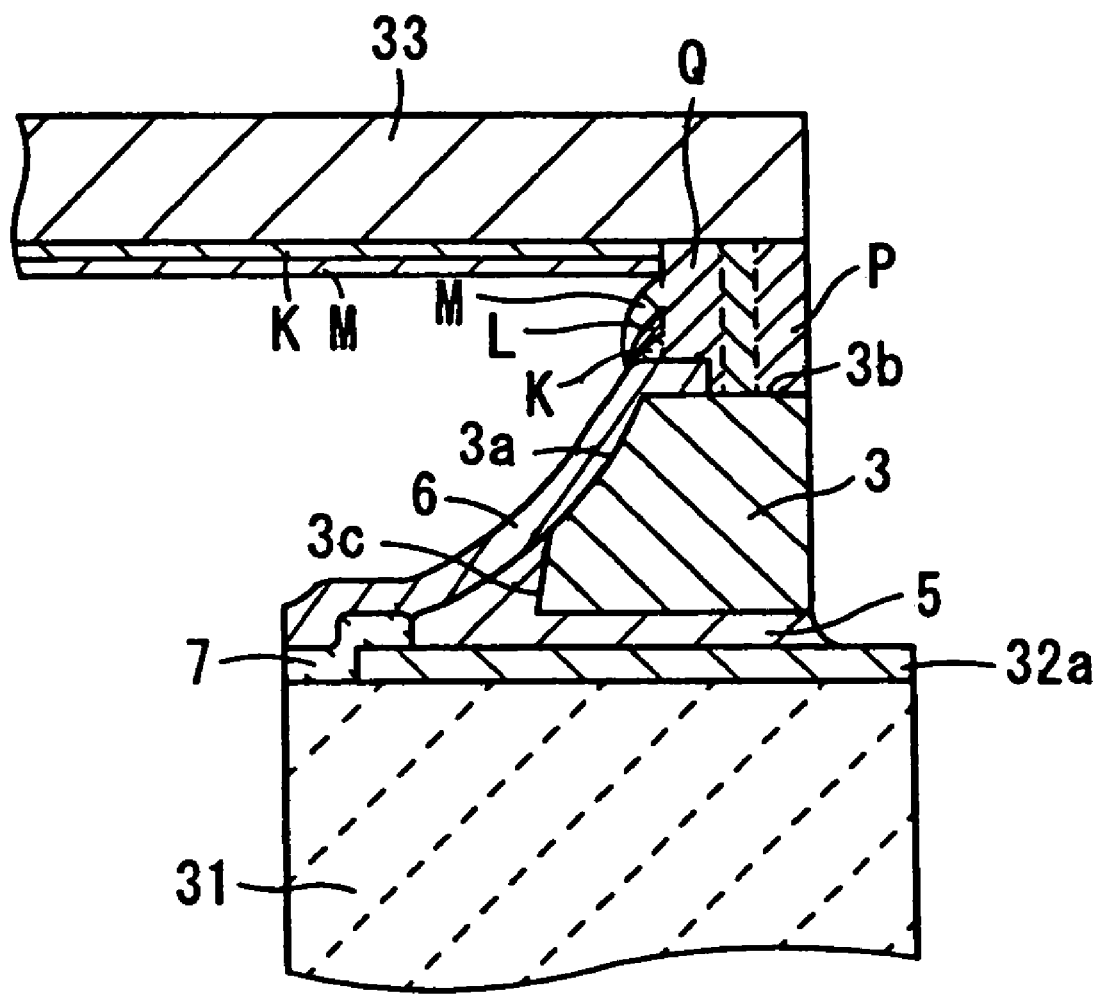
Figure 10:
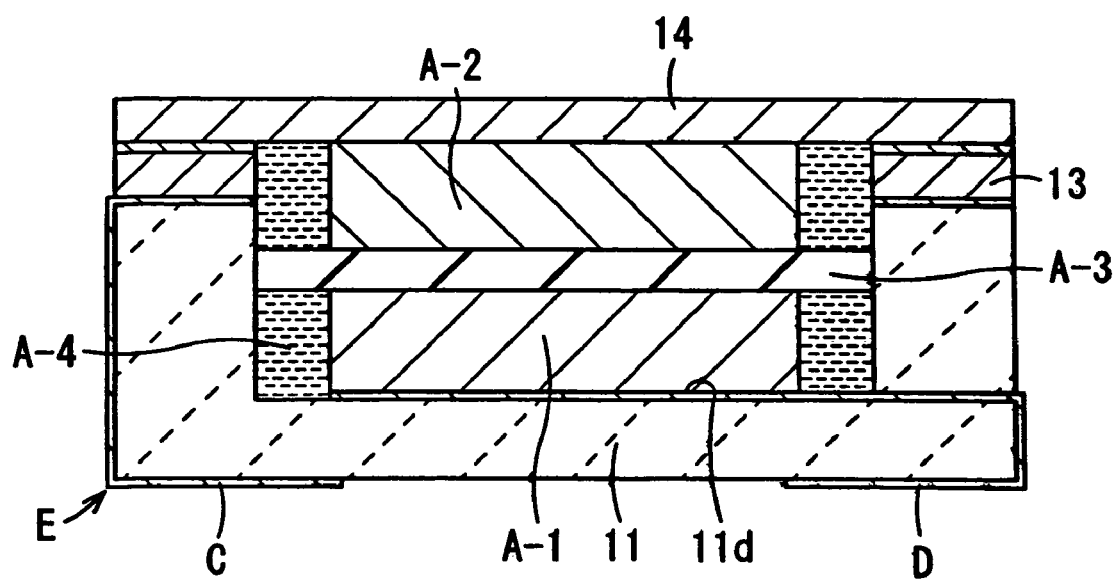
FIG. 10 is a cross sectional view showing an example of a battery or an electric double layer capacitor according to the related art.

FIG. 6A is a cross sectional view showing a ceramic container according to a third embodiment of the invention, and FIG. 6B is a plan view showing in a state which excludes a lid body of the ceramic container shown in FIG. 6A. FIG. 7A is an enlarged cross sectional view showing a part of FIG. 6A, and FIG. 7B is an enlarged cross sectional view showing a section VIIB shown in FIG. 7A. FIG. 8 is a cross sectional view showing a battery or an electric double layer capacitor according to another embodiment of the invention.

In the drawings, the ceramic container B1 comprises the base (hereinafter referred to as a ceramic base) 31 made of ceramics. A hollow or open portion 31a in the form of a rectangular, square columnar or circular columnar shape is formed in the central portion at the upper surface of the ceramic base 31. A metallized layer 31b is formed on a surface of the ceramic base 31 defining a bottom of the hollow or open portion 31a and a metal layer 32a is formed at the upper surface of the base 31 along the periphery of the ceramic base 31 defining the hollow or open portion 31a. Further, a first conductor layer C1 and a second conductor layer D1 which are independent from each other are disposed to the lower surface of the base 31. In the ceramic base 31, a first internal wiring 31b-A and a first lateral surface conductor 31b-B are formed The first internal wiring 31b-A is formed from the metallized layer 31b to the outer lateral surface of the substrate. The first lateral surface conductor 31b-B is formed on the outer lateral surface of the base 31, and electrically connects the first internal wiring 31b-A and the first conductor layer C1. The ceramic base 31 includes a side wall 32 which defines the hollow or open portion 31a. The metal layer 32a is formed at the upper surface of the side wall 32 along the entire circumference or partially formed on the upper surface thereof. Corner wiring conductors 32b are formed vertically to the corners of the side wall 32 of the base 31 and electrically connected to the metal layer 32a. A second internal wiring 32c is formed on the lower end of the side wall 32 for a portion extending from the surface of the ceramic base 31 defining the bottom of the hollow or open portion 31a and electrically connected to the corner wiring conductors 32b. A second lateral surface conductor 32d makes electrical connection from the second internal wiring 32c to the second conductor layer D1 disposed on the lower surface of the ceramic base 31. A plate-like lid body 33 made of an iron alloy is bonded with the metal layer 32a via an aluminum-gold-nickel alloy P at the outer circumference and bonded via an aluminum alloy Q containing aluminum as a main ingredient at the inner circumference of the bonded portion between the lid body 33 and the metal layer 32a.

Further, in FIG. 8, a battery A1 of the invention comprises the ceramic container B1 mentioned above, a battery element comprising a positive electrode plate B-1, a negative electrode plate B-2, an insulation sheet B-3 and an electrolytic solution B-4, and the lid body 33.

Further, an electric double layer capacitor A1 of the invention comprises the ceramic container B1 mentioned above, an electric double layer capacitor element comprising a first electrode B-1, a second electrode B-2, a separator B-3, and an electrolytic solution B-4, and a lid body 33.

In FIG. 7A, dotted lines showing the range for the aluminum-gold-nickel alloy P and the aluminum alloy Q schematically show the respective regions but they do not define the range of the regions. In the vicinity of the bonded regions of the alloys, each of the materials is present in a mixed state such that the concentration of each of the metal ingredients changes continuously from the aluminum-gold-nickel-alloy P at the outer circumference of the bonded portion to the aluminum alloy Q containing aluminum as the main ingredient at the inner circumference Further, in FIG. 6A, FIG. 6B and FIG. 8, the nickel layer, the gold layer, and the aluminum layer are not illustrated.

The ceramic base 1 comprises an sintered alumina ($Al_2O_3$), sintered mullite ($3Al_2O_3 \cdot 2SiO_2$), sintered aluminum nitride (AlN), glass ceramics, etc. and is manufactured as described below. For example, in a case where the ceramic base 31 comprises sintered alumina, an appropriate organic binder, a solvent, etc. are added and mixed to a starting powder such as aluminum oxide ($Al_2O_3$), silicon oxide ($SiO_2$), magnesium oxide (MgO), and calcium oxide (CaO) to form a slurry. The slurry is formed into a ceramic green sheet (hereinafter also referred to as a green sheet) by a doctor blade method or a calender roll method and cut into a predetermined size. Then, a plurality of green sheets selected from them are applied with an appropriate punching fabrication for forming the hollow or open portion 31a, the first and the second lateral surface conductors 31b-B, 32d, and the corner wiring conductors 32b.

Then, a metal paste containing a metal powder such as tungsten (W) as the main ingredient is printed and coated at a predetermined portion of the green sheet to form a metal paste layer forming the metal layer 32a, the metallized layer 31b, the first and the second internal wirings 31b-A and 32c, the first and the second lateral surface conductors 31b-B and 32d, the corner wiring conductors 32b, and the first and the second conductor layers C1 and D1 and then the green sheets formed with such metal paste layers are stacking and baked at a temperature of about 1600° C. Thus, the ceramic base 31 is manufactured.

In the ceramic container B1, the ceramic base 31 is less corroded by the electrolytic solution B-4 containing the organic solvent, the acid, etc. and this can prevent the disadvantage that the impurity dissolving from the ceramic base 31 intrudes into the electrolytic solution B-4 to deteriorate the electrolytic solution B-4. Accordingly, the ceramic container B1 capable of satisfactorily keeping the battery performance can be obtained. Further, in a case of forming the ceramic base 31 with sintered AlN, since the heat during operation can be diffused efficiently to the outside, a ceramic container B1 of high reliability in which the electrolytic solution is scarcely natured by the heat can be provided.

The first internal wiring 31b-A and the first lateral surface conductor 31b-B make electrical connection from the metallized layer 31b to the first conductor layer C1 to constitute a first wiring conductor. Further, the corner wiring conductors 32b, the second internal wiring 32c and the second lateral surface conductor 32d make electrical connection from the metal layer 32a to the second conductor layer D1 to constitute the second wiring conductor. While the first and the second wiring conductors are attained with such a constitution in this embodiment, they are not restrictive but they may be attained by any constitution so long as they make electrical connection between the metallized layer and the first conductor layer, and electrical connection between the metal layer and the second conductor layer. For example, the second wiring conductor may be formed by a through conductor penetrating the inside of the ceramic base 31 from the metal layer 32a to the second conductor layer D1 and the first wiring conductor may be formed in the same manner by a through conductor penetrating the inside of the ceramic base 31 from the metallized layer 31b to the first conductor layer C1.

In this embodiment, the second internal wiring 32c is formed inside the ceramic base 31 at the portion extending from the surface of the ceramic base 31 defining the bottom of the hollow or open portion 31a and formed so as not to be exposed to the outer lateral surface of the ceramic base 31. This constitution is adapted for preventing the disadvantage described below. In a case where the second internal wiring 32c is exposed to the lateral surface of the ceramic base 31 upon bonding the battery A1 to the external electric circuit substrate, the solder creeping upward along the second lateral surface conductor 32d flows laterally along the second lateral surface conductor 32d when the second external wiring 32c is exposed to the lateral surface of the ceramic base 31, to lack in the amount of the solder for connecting the second conductor layer D1.

Further, the first lateral surface conductor 31b-B is formed on the outer lateral surface of the ceramic base 31 from the lower end of the side wall 32 to the lower surface of the ceramic base 31, and the second lateral surface conductor 32d is also formed to the outer lateral surface of the ceramic base 31 in the same manner from the lower end of the side wall 32 to the lower surface of the ceramic base 31, so that the first lateral surface conductor 31b-B and the second lateral surface conductor 32d are at an identical height. Thus, when the battery A1 is bonded to the external electric circuit substrate, it can be bonded in a well-balanced state of the solder meniscus at the first and the second lateral surface conductors 31b-B and 32d, with no disadvantage that the battery A1 is bonded in an inclined attitude and a sufficient bonding strength can be obtained.

It is not always necessary that the first lateral surface conductor 31b-B and the second lateral surface conductor 32d are located to the outer lateral surface of the ceramic base 31 at positions opposing to each other but may be arranged optimally depending on the convenience of the design. However, formation of the first lateral surface conductor 31b-B and the second lateral surface conductor 32d to the outer lateral surface of the ceramic base 31 at positions opposed to each other is preferred in view of the following points.

That is, the height of the first lateral surface conductor 31b-B is made identical with the height of the second lateral surface conductor 32d. Accordingly, the size of the meniscus of the solder during soldering is balanced and, in addition, since the first lateral surface conductor 31b-B and the second lateral surface conductor 32d are formed to the outer lateral surface of the ceramic base 31 at the positions opposing to each other, the surface tension of the solder exerts on both sides of the gravitational center of the ceramic base 31, and this can prevent the tombstone phenomenon (phenomenon where an electronic part turns upward vertically with one side being downwarded because the surface tension of the solder does not exert equally on both lateral surfaces). As a result, it is possible to improve the working efficiency upon mounting and a favorable bonding reliability can be obtained in the bonding to the wiring conductors of the external electric circuit substrate. Further, such an arrangement is preferred since a greatest insulation distance can be taken between the lateral surface conductors 31b-B, and 32d.

In the example of FIGS. 6A and 6B, each of the first lateral surface conductor 31b-B and the second lateral surface conductor 32d is formed as a so-called castellation conductor in which the conductors are formed to the inner lateral surface of grooves formed vertically on the lateral surfaces to which the first and second lateral surface conductors are disposed respectively.

In a case of forming the first lateral conductor 31b-B and the second lateral surface conductor 32d as the castellation conductors, it is possible to form a solder meniscus to the hollow or open surface of the castellation conductor to firmly bond the ceramic container B1 and the wiring conductors of the external electric circuit substrate and, in addition, since the state of solder bonding can be confirmed visually, so that bonding at high reliability can be attained.

While the ceramic container B1 of the invention is shown for the rectangular shape as shown in FIGS. 6A, 6B, 7A, 7B and 8 as an example, it may be a polygonal columnar shape or circular columnar shape in view of the vertical direction with no trouble and also the shape of the conductor layers, etc. may be changed into a desired shape to obtain a desired shape.

Further, on each surface of the metallized layer 31b, the metal layer 32a, the corner wiring conductors 32b, the first and the second lateral surface conductors 31b-B and 32d, and the first and the second conductor layers C1 and D1 formed in the ceramic base 31 manufactured as described above, metals excellent in the corrosion resistance and excellent in the wettability with the solder, specifically, a nickel (Ni) layer of 1 to 12 μm thickness and a gold (Au) layer of 0.3 to 5 μm thickness are preferably deposited successively by a plating method or the like. This can prevent oxidative corrosion of them and improve the solder wettability upon soldering and form a solder meniscus of a desired size.

Further, in a case where an aluminum (Al) layer M is further deposited at a thickness of 1 to 15 μm to the surface of the plating film over the surface of the metallized layer 31b and the metal layer 32a which are in direct contact with the electrolytic solution, for example, by a sputtering method, since Al has a property less corroded with the electrolytic solution B-4, this can effectively suppress the nickel layer, gold layer and W as the main metal ingredient of the metallized layer 31b are dissolved into the electrolytic solution B-4 by the voltage due to charge and discharge. Further, since the Ni layer and the Au layer deposited to the first and second conductor layers C1 and D1 improve the wettability with the solder, bonding with the wiring conductors on the external electric circuit substrate (not shown) is made stronger.

The aluminum layer M has an effect of protecting the conductive portion against the electrolytic solution B-4 formed by dissolving a lithium salt, for example, lithium tetrafluoro borate and an acid such as hydrochloric acid, sulfuric acid or nitric acid in an organic solvent such as dimethoxyethane or propylene carbonate and prevent corrosion of them with the electrolytic solution B-4. The thickness of the aluminum layer M is preferably from 1 to 15 µm. In a case where it is less than 1 µm, it is difficult to prevent corrosion by the electrolytic solution B-4 tending to deteriorate the performance of the electrolytic solution B-4. Further, in a case where the thickness exceeds 15 µm, this takes a much time for forming the layer and, in addition, this undesirably increases the welding temperature when the metal layer 32a is welded to the lid body 33 by resistance welding such as seam welding.

The sputtering method is a method of utilizing a phenomenon of causing argon (Ar) ions, etc. to collide with the surface of an aluminum pellet as a target disposed in a reduced pressure atmosphere thereby emitting aluminum atoms from the aluminum surface into the atmosphere and depositing the aluminum atoms to the surface of an object disposed in the vicinity. The sputtering method is one of most appropriate methods as the method of forming the aluminum layer M in that a dense film can be formed. For forming the aluminum layer M, a vapor deposition method, a plating method or a welding method may be also adopted in addition to the sputtering method.

The first and the second conductor layers C1 and D1 are formed on the lower surface of the ceramic base 31, and the first and the second conductor layers C1 and D1 are bonded to the wiring conductors on the surface of an external electrode circuit substrate via a solder, thereby connecting the battery A1 of the invention with the external electrical circuit.

As described above, since the first and the second conductor layers C1 and D1 are directly bonded via the solder to the wiring conductors on the surface of the external electric circuit substrate, the ceramic container B1 of the invention can be easily connected by the surface mounting to the wiring conductors on the surface of the external electric circuit substrate without using external connection terminal members, etc. to provide excellent mass productivity.

Further, in the invention, the first and second conductor layers C1 and D1 are preferably divided, respectively, into plural portions. This can decrease the area of contact between the first and second conductor layers C1 and D1 and the external electric circuit substrate, and transmission of the heat from the molten solder to the first and second conductor layers C1 and D1 can be suppressed effectively upon soldering the ceramic container B1 to the external electric circuit substrate. As a result, it is possible to effectively suppress the exertion of the thermal stress on the ceramic container B1 and greatly improve the reliability of the airtightness of the ceramic container B1.

Further, the first and second conductor layers C1 and D1 may be also formed to the lower surface of protrusions disposed to the lower surface of the ceramic base 31. This enables reliable connection with the electrodes on the surface of the external electric circuit substrate to improve the connection reliability even when the external electric circuit substrate warps. Further, since the lateral surface of the protrusions are in contact with external air for the entire circumference, cooling effect is increased and it is possible to effectively suppress the transmission of heat from the molten solder to the ceramic container B1 upon soldering the ceramic container B1 to the external electric circuit substrate which would cause distortion in the ceramic container B1.

The lid body 33 is formed of an iron series alloy such as an iron(Fe)-Ni-cobalt(Co) or an Fe—Ni. The lid body 33 is manufactured by cutting a metal plate of 0.2 to 0.5 mm thickness, for example, into a square shape conforming the outer profile on the upper surface of the ceramic base 31.

Bonding the lid body 33 and the metal layer 32a of the ceramic container B1 of the invention is conducted as described below. That is, a nickel layer K at a thickness of 1 to 12 µm a gold layer L at a thickness of 0.3 to 5 µm and an aluminum layer M at a thickness of 1 to 15 µm are deposited successively to the surface of the metal layer 32a at a thickness of 10 to 20 µm formed to the periphery of the ceramic base 31 defining the hollow or open portion 31a in the upper surface of the ceramic base 31 as described above. Further, a nickel layer K at a thickness of 2 to 5 µm and an aluminum layer M at a thickness of 1 to 10 µm are deposited successively to the surface of the lid body 33 to be bonded with the metal layer 32a by a plating method. Next, the lid body 33 is placed over the upper surface of the ceramic base 31 so as to oppose the metal layer 32a and the surface of the lid body to be bonded, that is, so as to cover the hollow or open portion 31a of the ceramic base 31, and then the metal layer 32a and the lid body 33 are bonded by a resistance welding method, for example, a seam welding method, of supplying a current to the outer circumferential end of the lid body 3 and the metal layer 2a.

The seam welding method is a method of supplying current to a conical roller while rotationally moving the side of the roller along the portion to be bonded, and forming a welded portion linearly. The resistance welding method also includes a spot welding method or a TIG welding method in addition to the seam welding method, and the seam welding method is preferred in that the welding can be conducted linearly and the airtightness is improved.

Then, by applying the seam welding to the outer circumferential end of the lid body 33, a large current flows to the outer side of the bonded portion between the lid body 33 and the metal layer 32a, the aluminum layer M and the nickel layer K on the outer side deposited to the bonded portion between the metal layer 32a and the lid body 33 are melted in an extremely short time to form an eutectic state at a temperature of about 800 to 900° C. and gold in the gold layer K is intaken although in a small amount, to form an aluminum-gold-nickel alloy P in a frame-like shape. As a result, a firm bonded state of extremely high reliability can be attained at the outer circumference of the bonded portion via the aluminum-gold-nickel alloy P.

Further, in the portion remote from the roller, that is, in the inner side of the bonded portion, the flowing current decreases, the welding temperature is somewhat higher than the melting point of aluminum (663° C.), thereby the aluminum layer M deposited to the bonded portion between the metal layer 32a and the lid body 33 is mainly melted to form an aluminum alloy Q containing aluminum as a main ingredient to the inner circumferential side of the bonded portion in a frame-like shape. As a result, the inner circumference of the bonded portion can be formed as a bonded portion bonded with the aluminum alloy Q containing, as the main ingredient, aluminum less corrosive to the electrolytic solution B-4 filled inside the battery A1. The temperature for the bonded portions can be controlled depending on the current supplied to the roller, the rotational speed of the roller, and the pressure of urging the roller to attain the temperature distribution as described above.

Further, according to the manufacturing method, at the bonded portion most remote from the roller (inner circumferential end of the bonded portion), since the current rounds about from the outer circumference of the bonded portion and, as a result, the supplied current is decreased, a temperature distribution near the melting temperature of aluminum (663° C.) can be formed at the bonded portion. Accordingly, the aluminum layer M on the side of the lid body 33 and the aluminum layer M on the side of the metal layer 32a are melted and integrated on the inner side, to form a bonded portion of the aluminum-gold-nickel alloy P on the outer circumference and the aluminum alloy with no interruption making it possible to obtain a structure less corroded by the electrolytic solution B-4. This can also reliably prevent the disadvantage that the electrolytic solution B-4 intrudes to the inside of the bonded portion.

In an example of this embodiment, in the seam welding, one end of the welding electrode is connected with the second conductor D1 at the lower surface of the ceramic container B1, the lid body 33 is placed over the upper surface of the ceramic base 31 so as to cover the hollow or open portion 31a, and the roller for seam welding is moved about at 10 mm/sec while supplying a current of about several amperes from above the lid body 33 to the outer circumferential end of the lid body 33 and the metal layer 32a, to obtain the ceramic container B1 bonded at the outer circumference via the aluminum-gold-nickel alloy P while bonded at the inner circumferential end via the aluminum alloy Q containing aluminum as the main ingredient. As a result, an aluminum-gold-nickel alloy P comprising from 60 to 70 mass % of aluminum, 1 to 2 mass % of gold, and 28 to 39 mass % of nickel is obtained at the outer circumference of the bonded portion between the lid body 33 and the metal layer 32a, while an aluminum alloy Q containing aluminum as a main ingredient with aluminum content of 99 mass % or more was attained at the inner circumference thereof.

Then, the battery A1 according to the invention is to be described specifically below.

The battery A1 of the invention comprises the ceramic container B1, the positive electrode plate B-1, the negative electrode plate B-2, the insulation sheet B-3 and the electrolytic solution B-4 as described above. The positive electrode plate B-1 is mounted to the upper surface of a metallized layer 31b and connected electrically therewith. The negative electrode plate B-2 is mounted above the upper surface of the positive electrode plate B-1 via a porous insulation sheet B-3 impregnated with an electrolytic solution B-4 so as to be in close contact with the lid body 33 and be connected electrically therewith.

In a case of disposing a bonding member containing carbon as a main ingredient between the metallized layer 31b and the positive electrode plate B-1 and between the negative electrode plate B-2 and the lower main surface of the lid body 33, electrical connection between each of them can be made more reliably.

Such an example has been shown that the positive electrode plate B-1 is arranged below the negative electrode plate B-2 and is electrically connected to the metallized layer 31b, and the negative electrode plate B-2 is electrically connected to the lid body 33. However, the arrangement of the positive electrode plate B-1 and the negative electrode plate B-2 may be turned upside down. That is, the negative electrode plate B-2 is electrically connected to the metallized laser 31b, and the positive electrode plate B-1 is arranged above the negative electrode plate B-2 via the insulation sheet B-3 and is electrically connected to the lower surface of the lid body 33.

The battery A1 is provided with airtightness of high reliability by using the ceramic container B1 of the invention to obtain a battery A1 capable of repeating charge and discharge stably. Then, the battery A1 can be connected easily by means of soldering, etc. with wiring conductors of an external electric circuit substrate because of the provision of the first and second conductor layers C1 and D1, and is excellent in the mass productivity of the external electric circuit substrate.

In the same manner as the embodiment described above, the positive electrode plate B-1 is formed of a plate-like body or sheet-like body containing a positive electrode active substance such as $LiCoO_2$, $LiMn_2O_4$ and a conductive material such as acetylene black or graphite, and a negative electrode plate B-2 is formed of a plate-like body or sheet-like body containing a negative electrode active substance made of a carbon material such as coke or carbon fiber.

The positive electrode plate B-1 is manufactured in the same manner as the embodiment described above.

The negative electrode plate B-2 is manufactured in the same manner as the embodiment described above.

Further, in the same manner as the embodiment described above, the insulation sheet B-3 comprises a non-woven fabric made of polyolefin fibers or a finely porous membrane of polyolefin. The electrolytic solution B-4 filled inside the ceramic container B1 is, in the same manner as the embodiment described above, for example, such an electrolytic solution that a lithium salt such as lithium tetrafluoro borate and an acid such as hydrochloric acid, sulfuric acid, or nitric acid are dissolved in an organic solvent such as dimethoxyethane or propylene carbonate. The insulation sheet B-3 is impregnated with the electrolytic solution B-4 and disposed between the positive electrode plate B-1 and the negative electrode plate B-2 thereby preventing contact between the positive electrode plate B-1 and the negative electrode plate B-2 and enabling movement of ion, for example, lithium ion in the electrolytic solution B-4 between the positive electrode plate B-1 and the negative electrode plate B-2.

Upon manufacturing the battery A1, the lid body 33 is bonded to the upper surface of the ceramic base 31 by rotationally moving a roller under current supply along the edge of the lid body 33 while urging slightly such that the metallized layer 31b, the positive electrode plate B-1, the insulation sheet B-3, the negative electrode plate B-2 and the lid body 33 are in close contact with each other, thereby melting the aluminum layer M, the gold layer L, and the nickel layer K on the surface of the lid body 33 and on the surface of the metal layer 32a.

While the electrolytic solution B-4 filled inside the ceramic container B1 has high corroding property and dissolving property, since the base 31 comprising ceramics is excellent in the chemical resistance by using the ceramic container B1 of the invention, less corroded by the electrolytic solution B-4 containing the organic solvent, acid or the like, the impurity does not dissolve from the ceramic container B1 and does not intrude into the electrolytic solution B-4, the electrolytic solution B-4 is not degraded. Accordingly, the battery performance can be kept favorably.

Further, in the battery A1 according to the invention, since the electrolytic solution B-4 is contained in the case A for battery having the ceramic base 31 and the lid body 33 which is bonded to the metal layer 32a of the ceramic base 31 firmly and at a good reliability by a resistance welding method such as the seam welding method, even when it is subjected to a temperature cycle test, the electrolytic solution B-4 does not leak through the gap formed by cracking or the like in the ceramic container B1 caused by thermal stress, the lid body 33 is not detached, or the electrolytic solution does not leak through the gap between the lid body 33 and the ceramic base 31 and, accordingly, the battery A1 that can operate for a long time can be provided.

Further, since the lid body 33 can be abutted against and electrically connected with the upper surface of the negative electrode plate B-2. Thereby, the electric resistance between the negative electrode plate B-2 and the lid body 33 can be decreased greatly by connecting the lid body 33 and the negative electrode plate B-2 for a wide area, to enable efficient charge and discharge, the battery A1 of high reliability capable of charging and discharging stably for a long time can be provided.

Then, the electric double layer capacitor A1 of the invention have the same constitution and the function and effect as those of the battery A1 described above.

That is, the electric double layer capacitor A1 of the invention comprises the ceramic container B1, the first electrode B-1, the second electrode B-2, separator B-3 and the electrolytic solution B-4 described above. The first electrode B-1 is disposed on the upper surface of the metallized layer 31b and electrically connected with the metallized layer 31b. The second electrode B-2 is disposed over the first electrode B-1 via a separator B-3 impregnated with the electrolytic solution B-4 so as to be in close contact therewith and electrically connected to the lid body 33.

The first electrode B-1 and the second electrode B-2 are manufactured in the same manner as the embodiment described above. In the electric double layer capacitor A1 of the invention, the first and second conductor layers C1 and D1 have no polarity, and they can be used with the first conductor layer C1 as the positive electrode and the second conductor layer D1 as the negative electrode, and vice versa.

The electrolytic solution B-4 of the electric double layer capacitor A1 is, in the same manner as the embodiment described above, for example, such an electrolytic solution that a lithium salt such as lithium hexafluoro phosphate ($LiPF_6$) or a quaternary ammonium salt such as tetraethyl ammonium tetrafluoro borate (($C_2H_5$)$_4NBF_4$) is dissolved in a solvent such as propylene carbonate (PC) or sulfolane (SLF).

Further, for the separator B-3, in the same manner as the embodiment described above, glass fibers or heat resistance resins such as polyphenylene sulfide, polyethylene terephthalate and polyamide can be used for instance.

Then, the electric double layer capacitor A1 is manufactured as described below. That is, the first electrode B-1, the separator B-3, the second electrode B-2, and the lid body 33 are placed to the upper surface of the metallized layer 31b so as to be in close contact with each other and the electrolytic solution B-4 is injected. Then, melted are the metal deposited on the lower surface of the lid body 33 and the surface of the metal layer 32a, by a seam welding method of bonding the lid body 33 with Joule heat generated by rotationally moving a roller under current supply along the edge of the upper surface of the lid body 33 while slightly urging the roller, or by using a supersonic welding method, thereby the lid body 33 is bonded to the upper surface of the base 31.

The invention is not restricted only to the examples of the embodiments described above but various modifications are possible within a range not departing the gist of the invention.

For example, while the material for the ceramic base 1, 31 of the ceramic container B, B1 has been explained as sintered alumina in the invention, the material of for the ceramic base may include other ceramics such as sintered aluminum nitride (AlN), glass ceramics, glasses, plastics, or other insulation materials. In a case where the material includes sintered AlN, heat during operation can be efficiently dissipated to the outside.

Further, in the embodiment described above, for example, while the description has been made to the battery or the electric double layer capacitor A, A1 using the ceramic container B, B1 having one hollow or open portion 1a, 31a. However, the ceramic container B, B1 may also have a plurality of hollow or open portions 1a, 31a. In this case, the lid body 4, 33 may be a single lid body 4, 33 covering all the hollow or open portions 1a, 31a or a plurality of lid bodies 4, 33 each covering each of the hollow or open portions 1a, 31a. In a case of using the ceramic container B, B1 having a plurality of hollow or open portions 1a, 31a, a battery or an electric double layer capacitor A, A1 of higher capacity can be obtained by connecting the batteries or the electric double layer capacitors A, A1 manufactured in each of the hollow or open portions 1a, 31a in parallel, or batteries A, A1 capable of supplying higher voltage can be obtained by serially connecting the batteries A, A1 manufactured in each of the hollow or open portions 1a, 31a.

Further, in the third embodiment of the invention, while the description has been made to the ceramic container B1 in which the lid body 33 is bonded directly over the base 31 made of ceramics, the battery and the electric double layer capacitor A1, in the same manner as the first and second embodiments of the invention, a seal ring 3 that is formed of an Fe—Ni—Co alloy or the like and serves as a frame member made of metal may be interposed between the base 31 and the lid body 33. In this case, in the same manner as a fourth embodiment of the invention shown in FIGS. 9A to 9E, the seal ring 3 may be brazed by an Ag brazing material 5 on the upper surface of the metal layer 32a, then a nickel layer K, a gold layer L, and an aluminum layer M may be formed at the surface 3b and then they may be joined with the lid body 33, and the lid body 33 may be bonded by the resistance welding method. In this embodiment, even when deformation of the ceramic base 31 is caused, the deformation can be absorbed by the seal ring 3.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A container comprising:
    a base having a hollow or open portion in one surface for containing a battery element or an electric double layer capacitor element and an electrolytic solution in an inside thereof;
    a metallized layer formed at a periphery of the base defining the hollow or open portion in one surface;
    a frame member made of metal brazed to the metallized layer so as to surround the hollow or open portion, an inner lateral surface thereof being inclined outward; and
    a corrosion resistant layer deposited so as to continuously cover the inclined surface of the frame member and a portion of the surface of the metallized layer situated inward thereof.

2. The container of claim 1, wherein the frame member has a vertical surface perpendicular to the metallized layer between the inclined surface and another surface of the frame member, and the fillet of the brazing material is formed from the inclined surface to one surface of the metallized layer situated inward thereof.

3. The container of claim 1, wherein the base is made of ceramics.

4. The container of claim 1, wherein an insulation coating layer is formed from a vicinity of an end of the brazing material inward of the frame member to one surface of the base, and an inner end of the corrosion resistant layer is extended as far as on the insulation coating layer.

5. The container of claim 2, wherein an insulation coating layer is formed from a vicinity of an end of the brazing material inward of the frame member to one surface of the base, and an inner end of the corrosion resistant layer is extended as far as on the insulation coating layer.

6. The container of claim 1, wherein an insulation coating layer made of sintered alumina is formed from the vicinity of the end of the brazing material inward of the frame member to one surface of the base, and an inner end of the corrosion resistant layer is extended as far as on the insulation coating layer.

7. The container of claim 2, wherein an insulation coating layer made of sintered alumina is formed from the vicinity of the end of the brazing material inward of the frame member to one surface of the base, and an inner end of the corrosion resistant layer is extended as far as on the insulation coating layer.

* * * * *